(12) United States Patent
Lee et al.

(10) Patent No.: US 7,550,327 B2
(45) Date of Patent: Jun. 23, 2009

(54) METHOD FOR FABRICATING THIN FILM TRANSISTOR SUBSTRATE

(75) Inventors: Chang Deok Lee, Cheongju-si (KR); Hyun Seok Hong, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 81 days.

(21) Appl. No.: 11/607,845

(22) Filed: Dec. 4, 2006

(65) Prior Publication Data

US 2007/0155068 A1   Jul. 5, 2007

(30) Foreign Application Priority Data

Dec. 29, 2005   (KR)   ............... 10-2005-0133543

(51) Int. Cl.
*H01L 21/00* (2006.01)
(52) U.S. Cl. .................. 438/149; 438/30; 438/151; 257/59; 349/42
(58) Field of Classification Search ......... 438/144–155; 257/59, E29.273; 349/42
See application file for complete search history.

(56) References Cited

U.S. PATENT DOCUMENTS

| | | | |
|---|---|---|---|
| 6,063,653 A | 5/2000 | Lin et al. | |
| 2004/0125327 A1* | 7/2004 | Choi et al. | 349/187 |
| 2004/0129943 A1* | 7/2004 | Yoo et al. | 257/72 |
| 2004/0197966 A1 | 10/2004 | Cho et al. | |
| 2004/0232421 A1* | 11/2004 | Ono et al. | 257/59 |
| 2005/0095759 A1 | 5/2005 | Cho et al. | |
| 2005/0130353 A1 | 6/2005 | Yoo et al. | |
| 2006/0145161 A1* | 7/2006 | Lee et al. | 257/72 |
| 2007/0164289 A1* | 7/2007 | Jung | 257/72 |

* cited by examiner

*Primary Examiner*—Ha Tran T Nguyen
*Assistant Examiner*—Daniel Whalen
(74) *Attorney, Agent, or Firm*—McKenna Long & Aldridge LLP

(57) ABSTRACT

This invention provides method for fabricating a thin film transistor substrate that is adaptive for forming a good pattern design and also removing a stepped difference using a three-mask process.

14 Claims, 44 Drawing Sheets

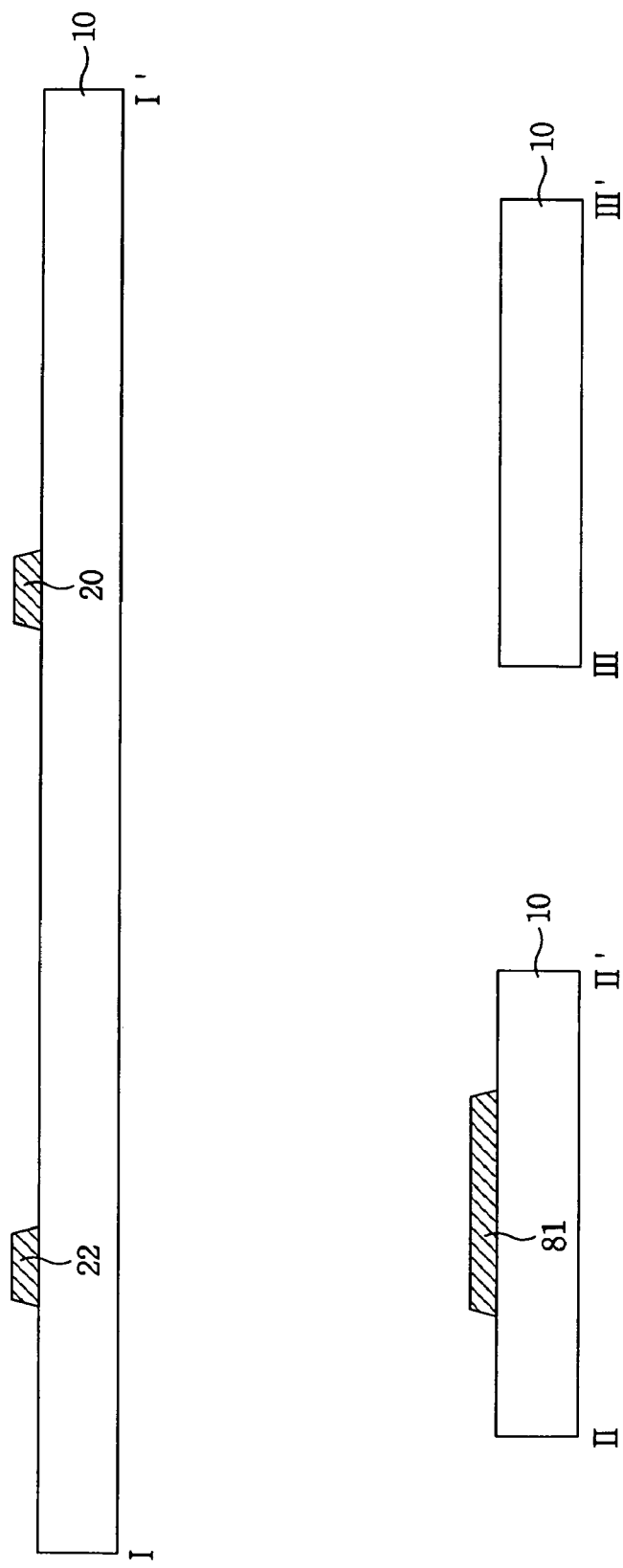

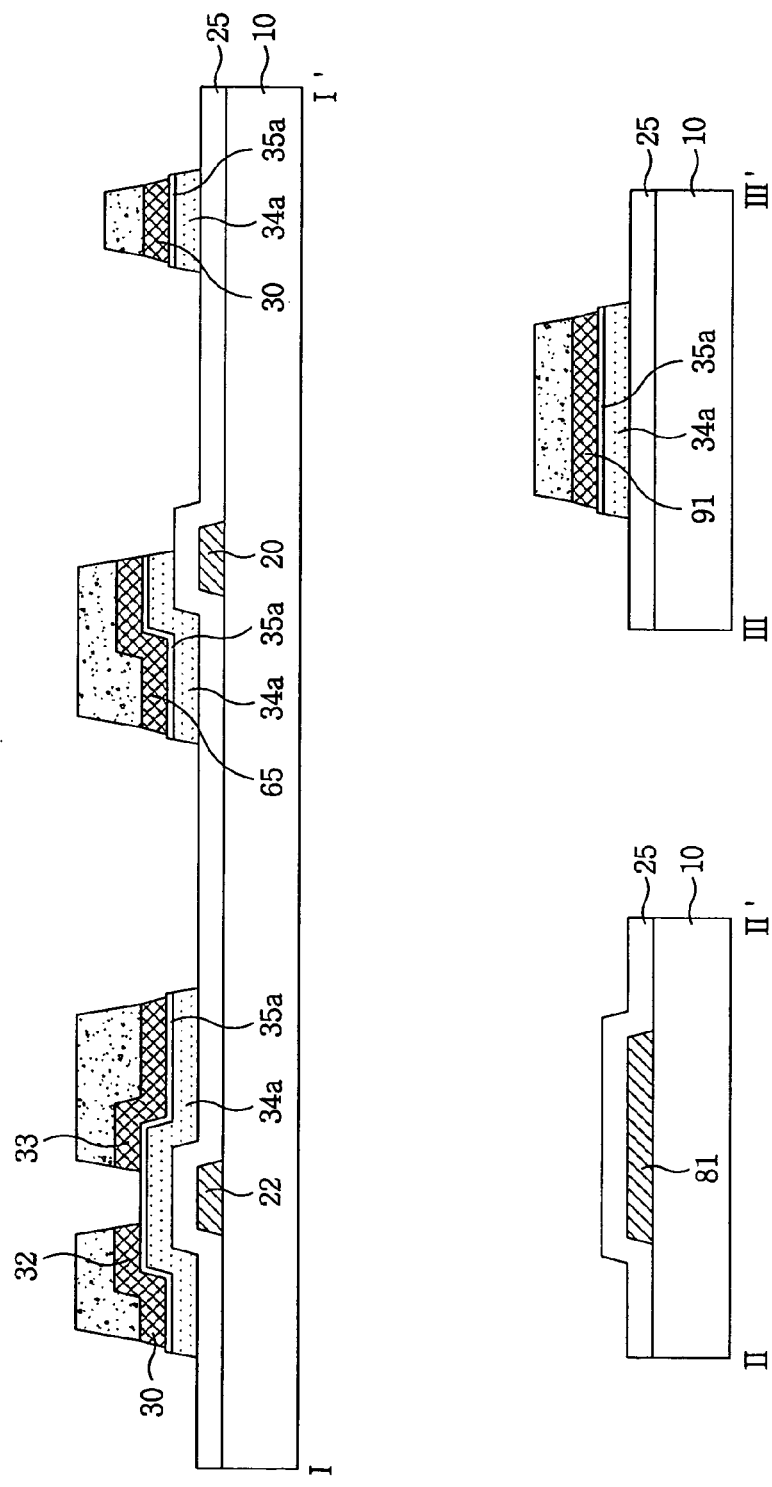

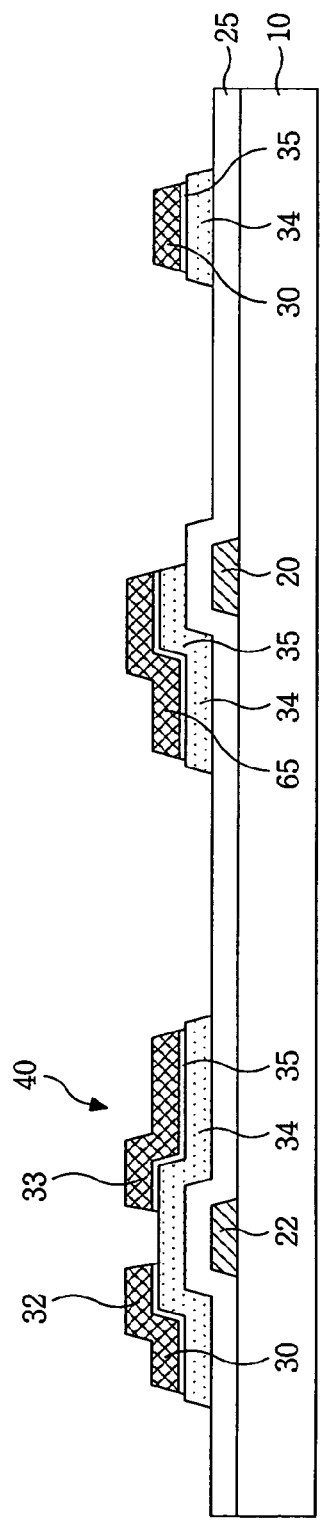
FIG.3H
RELATED ART

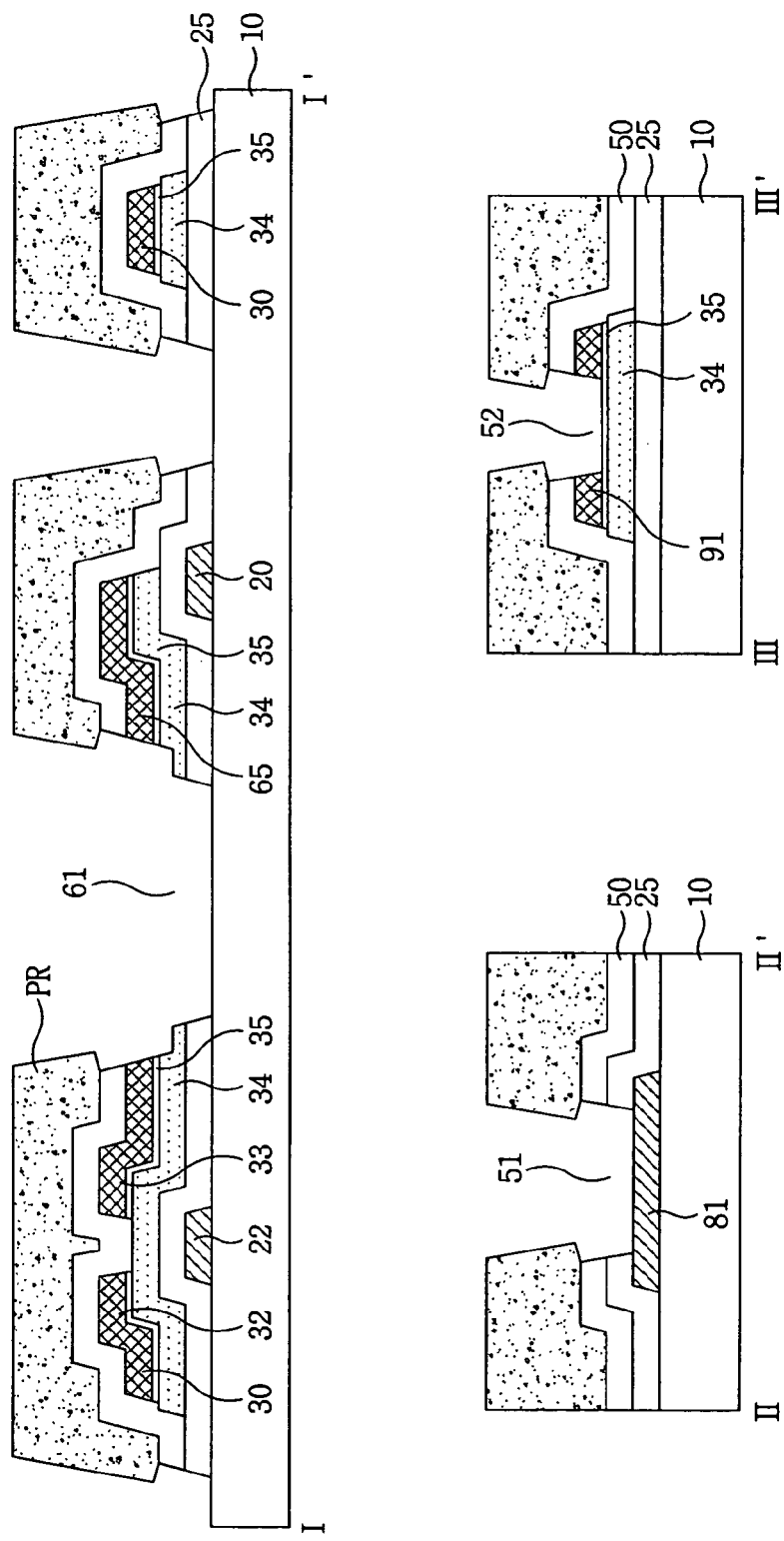

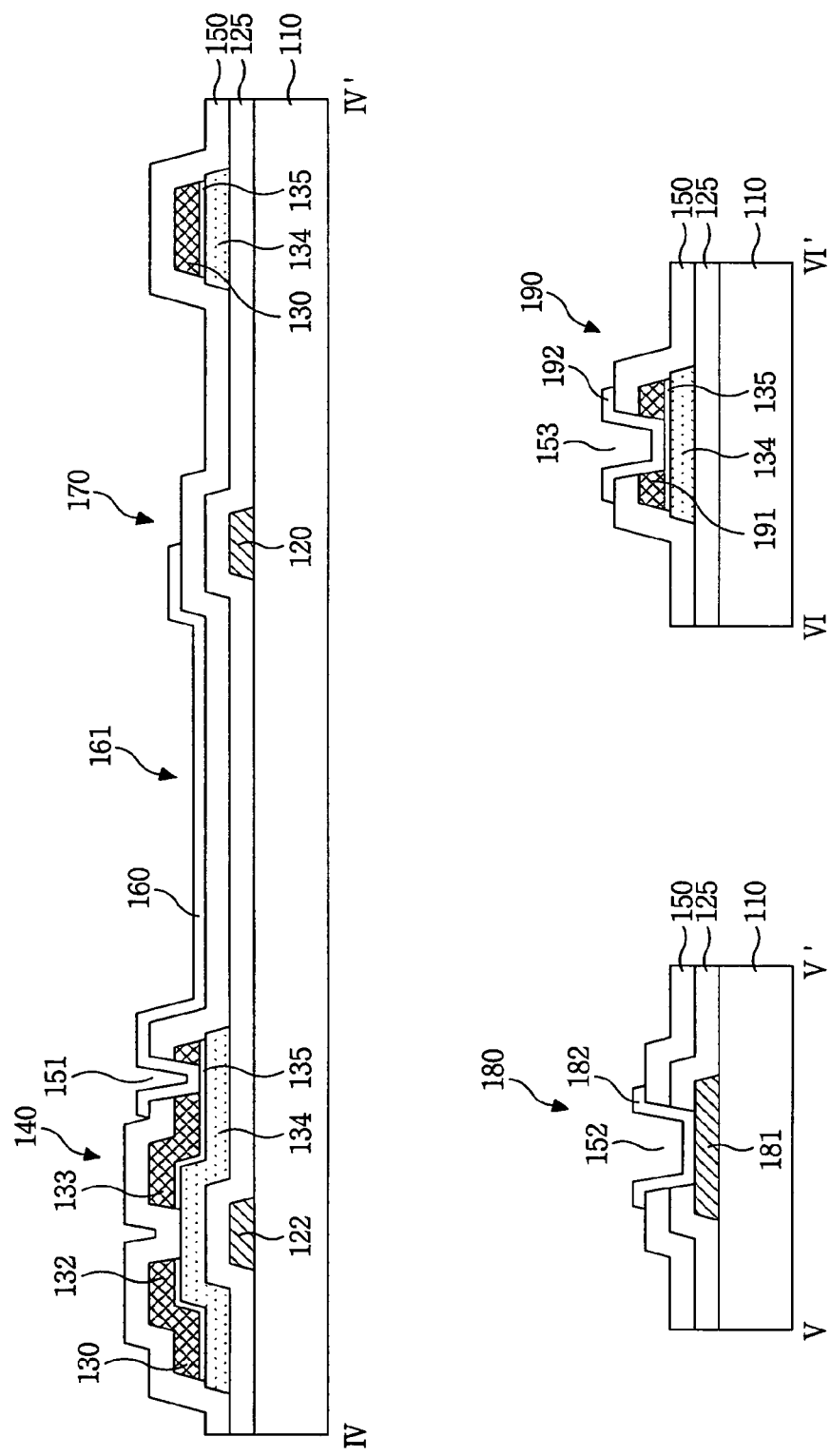

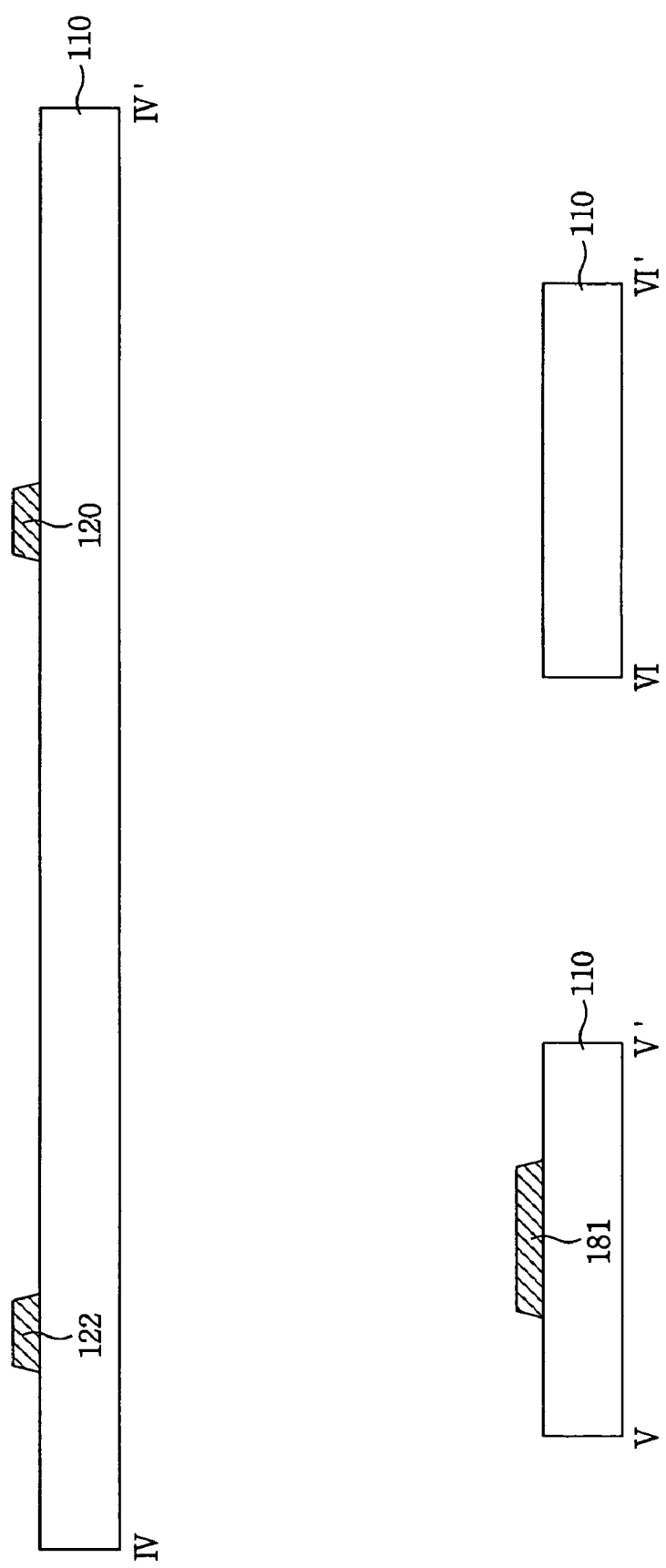

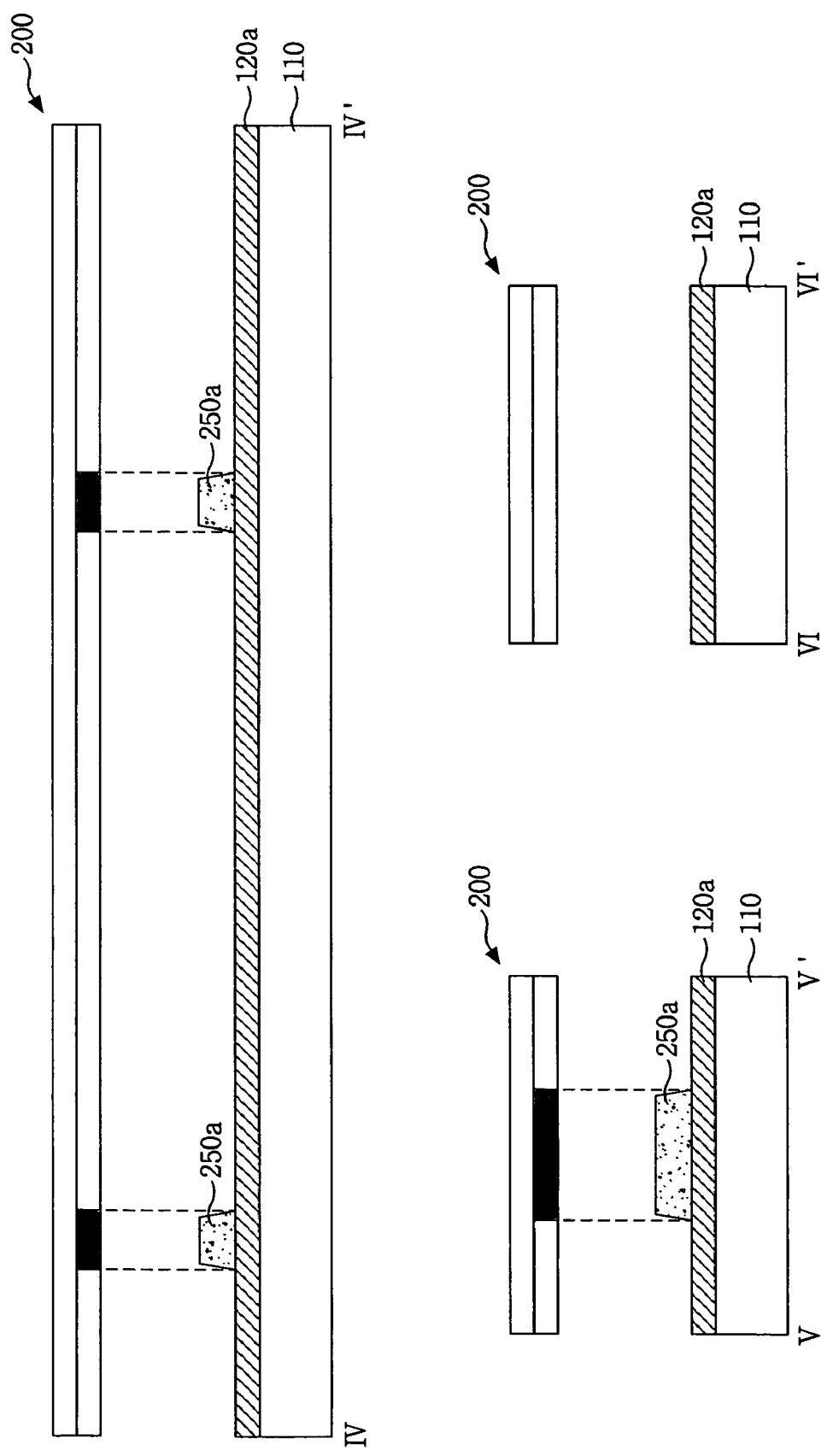

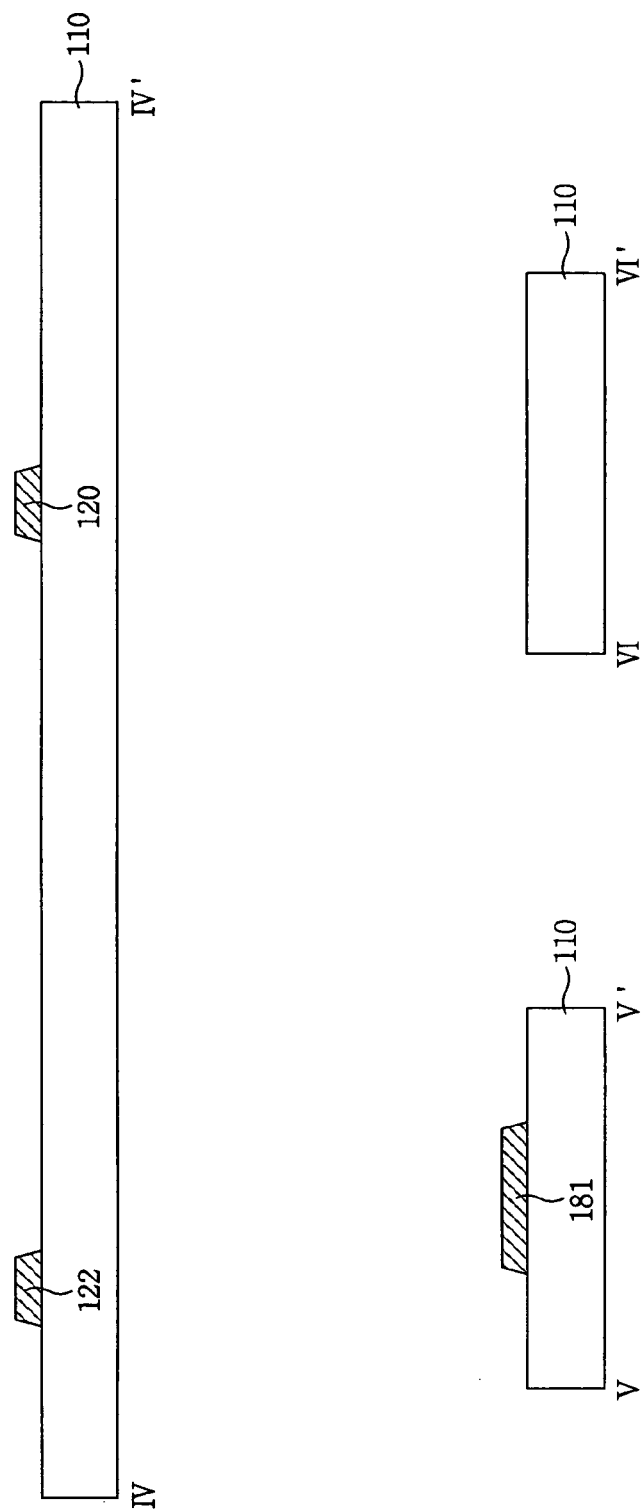

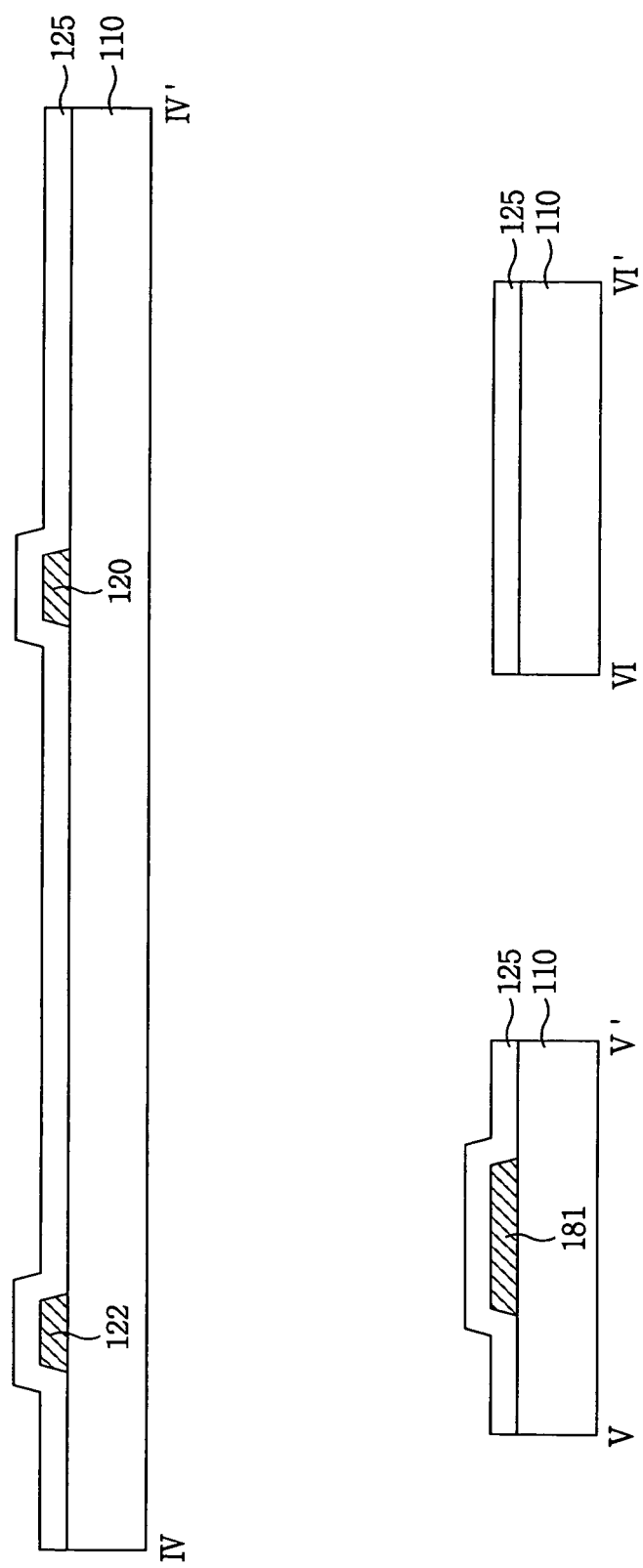

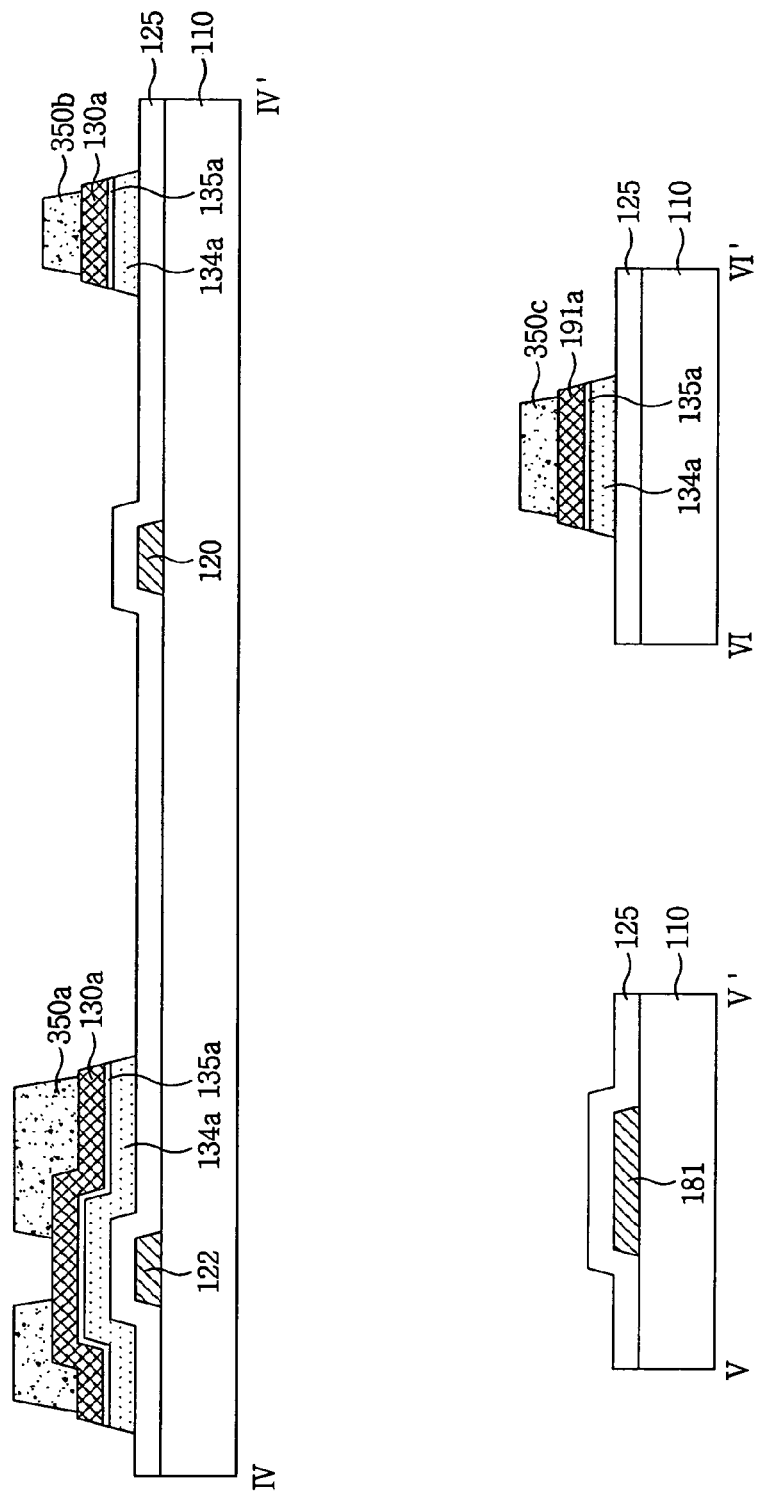

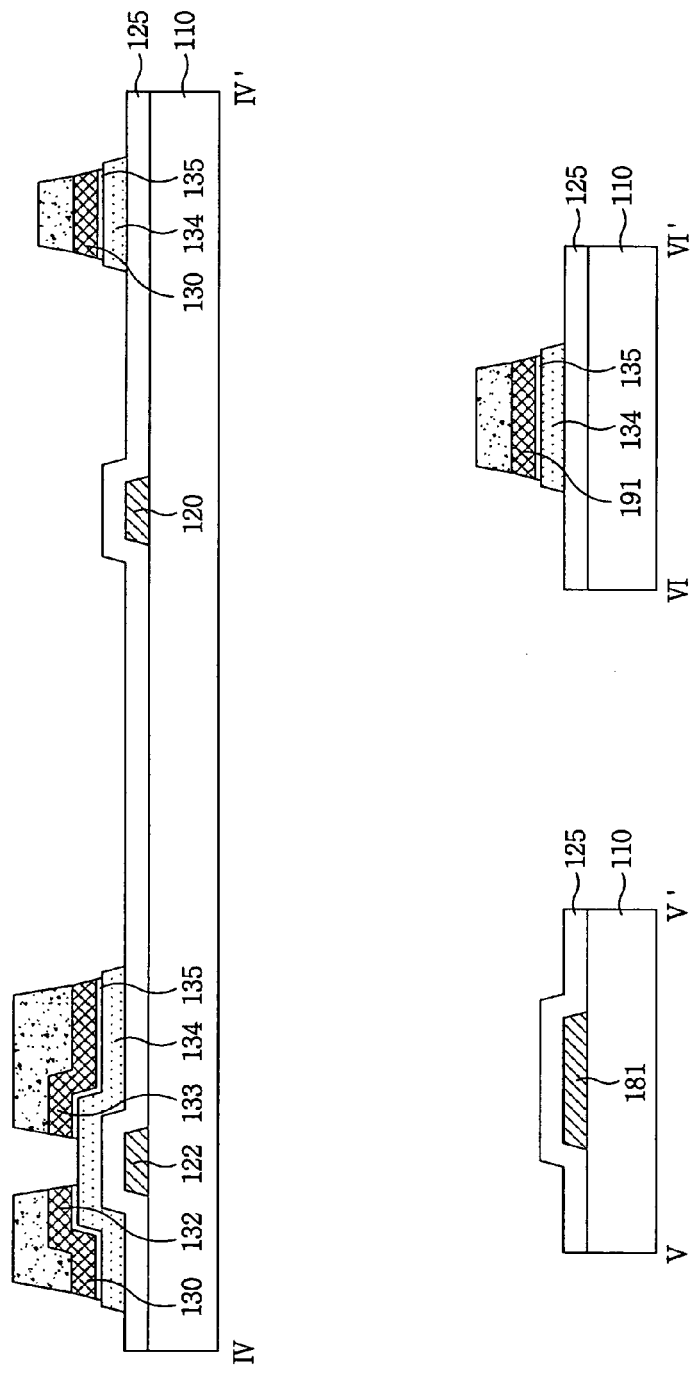

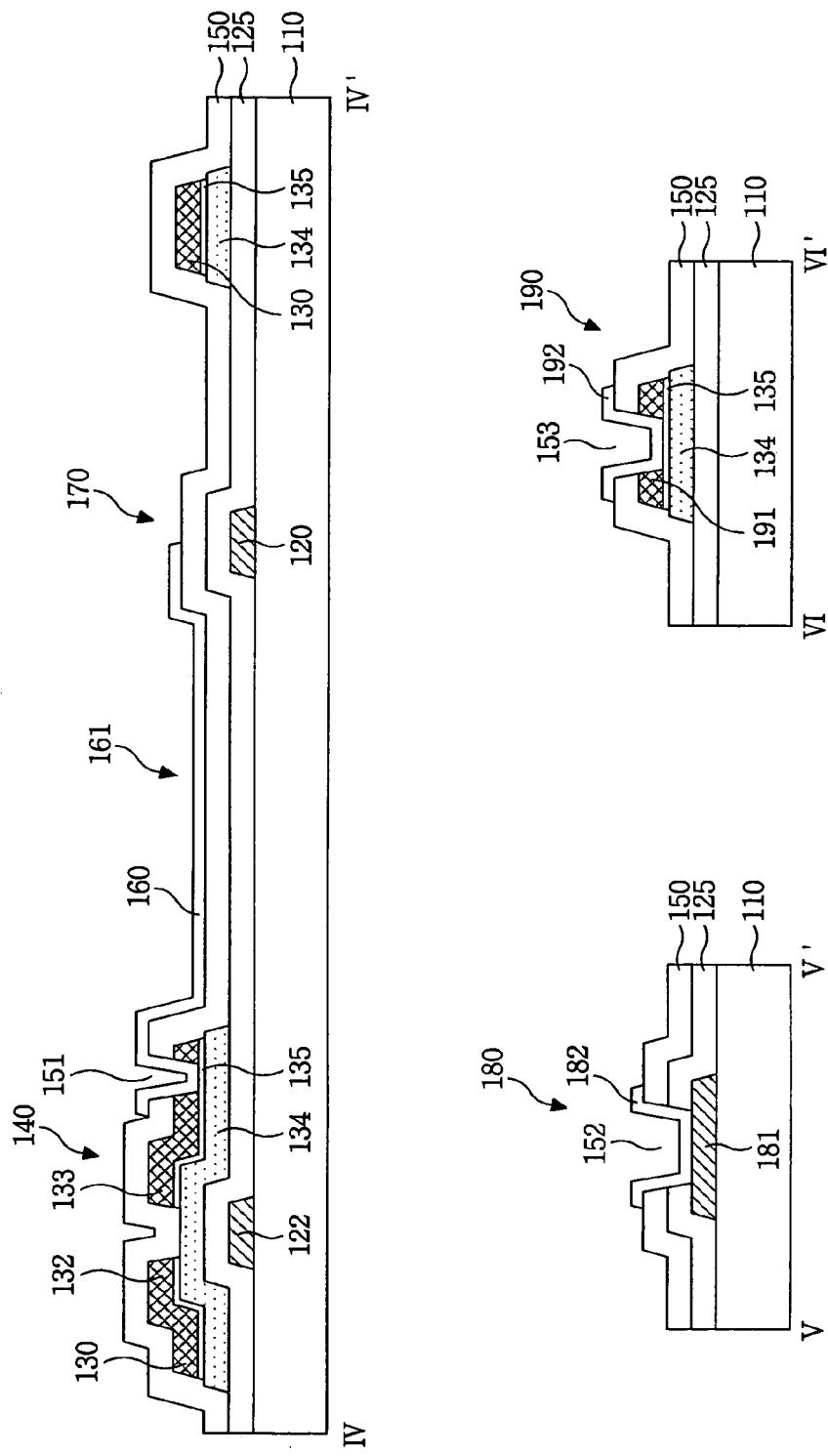

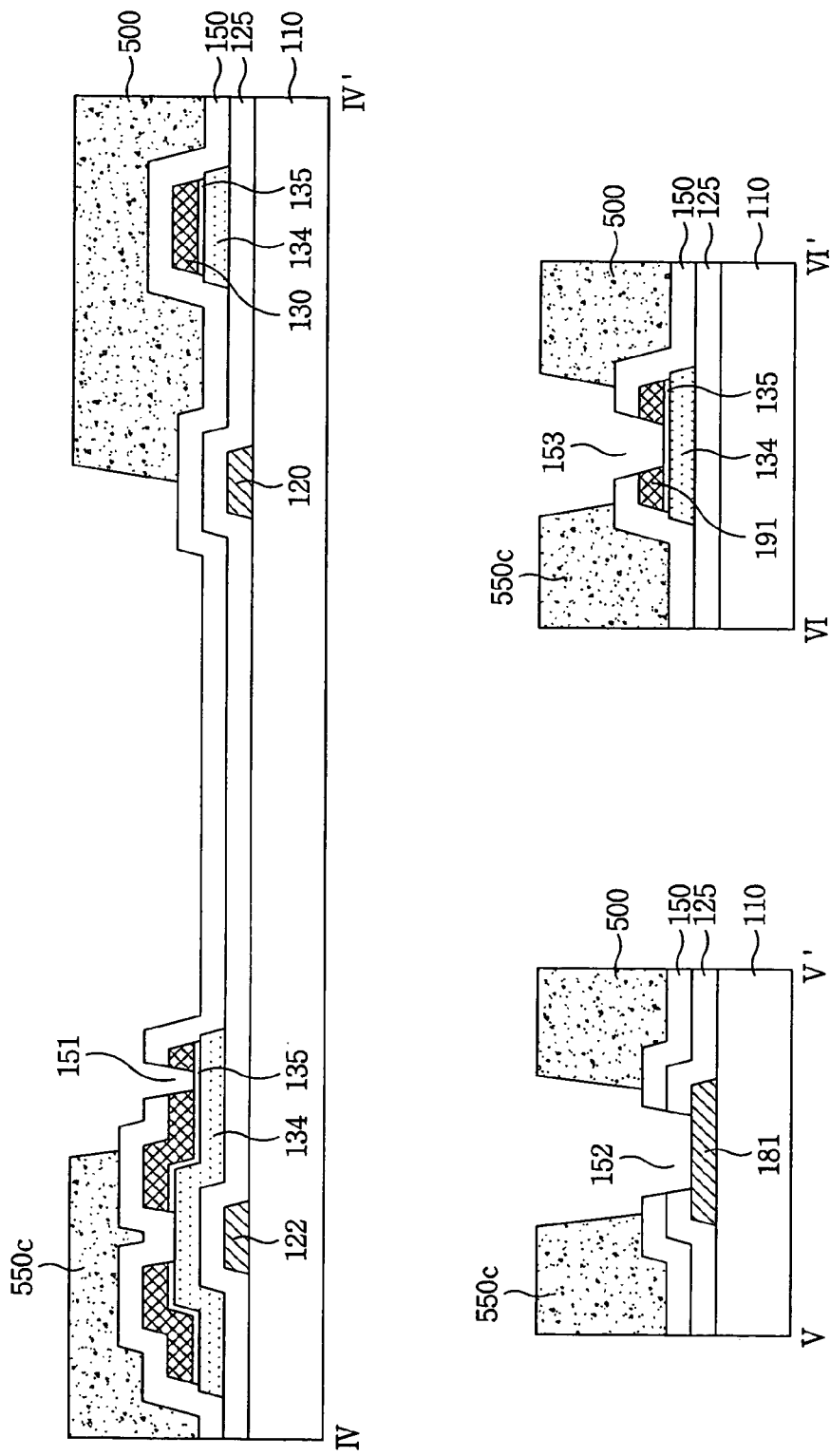

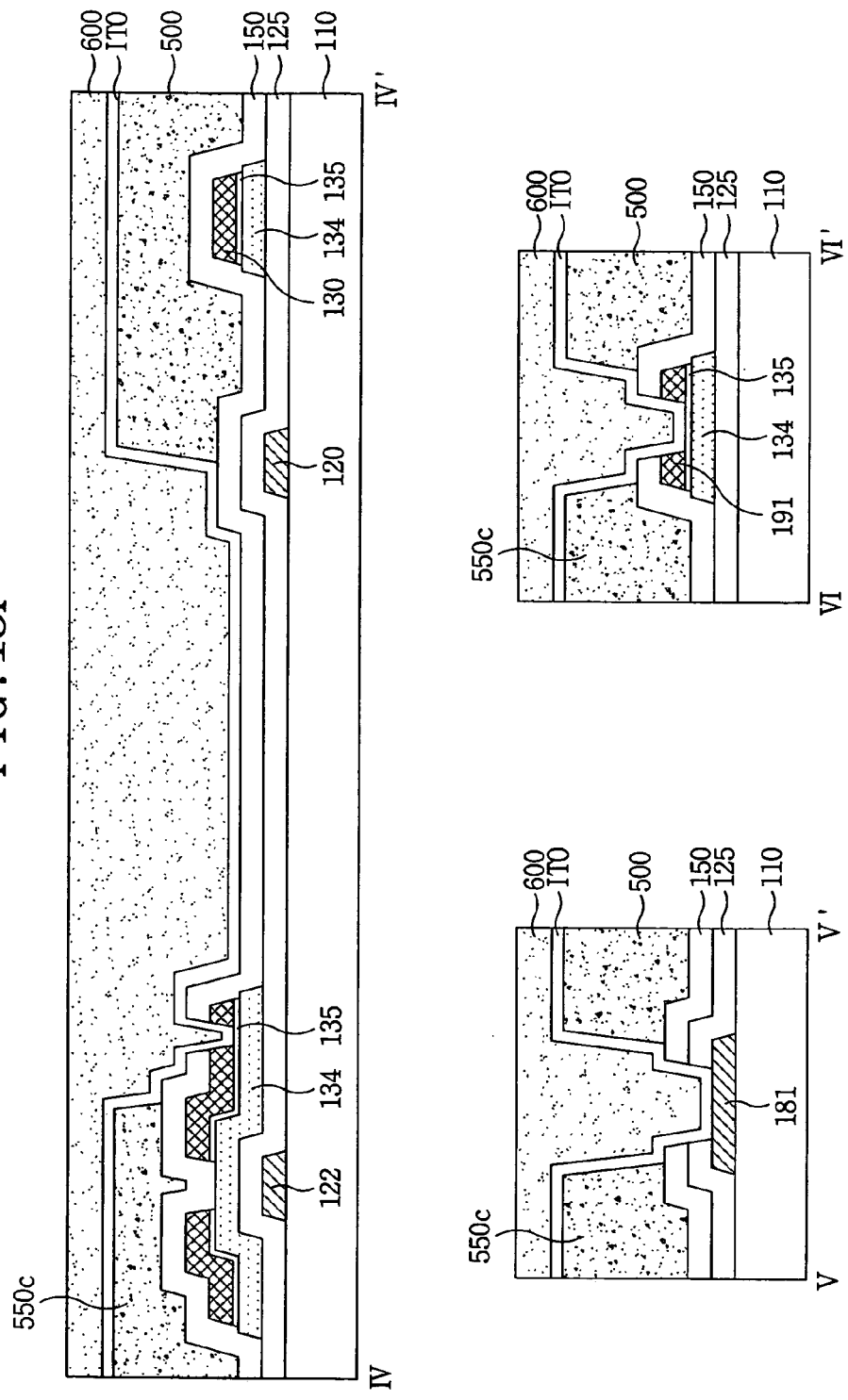

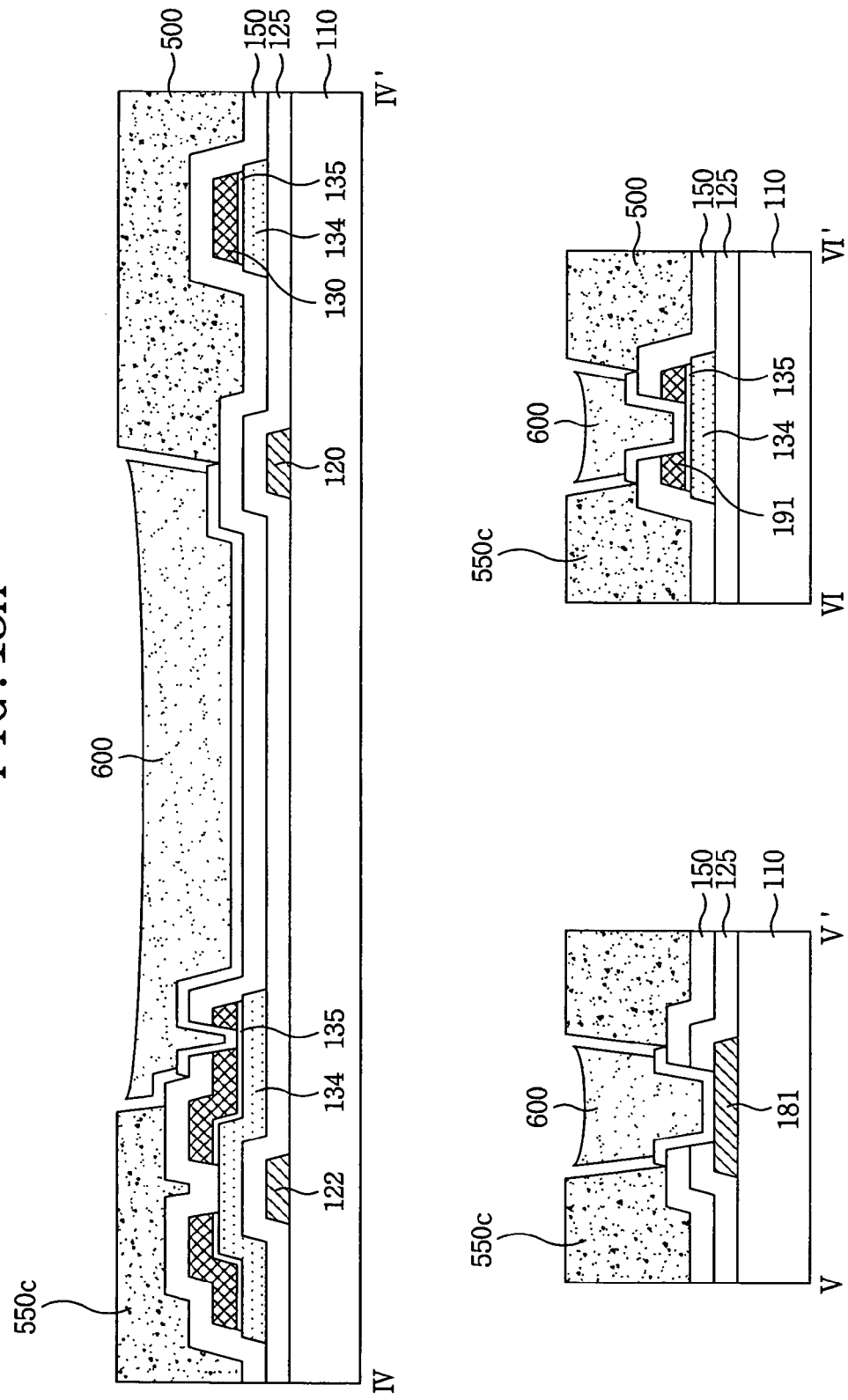

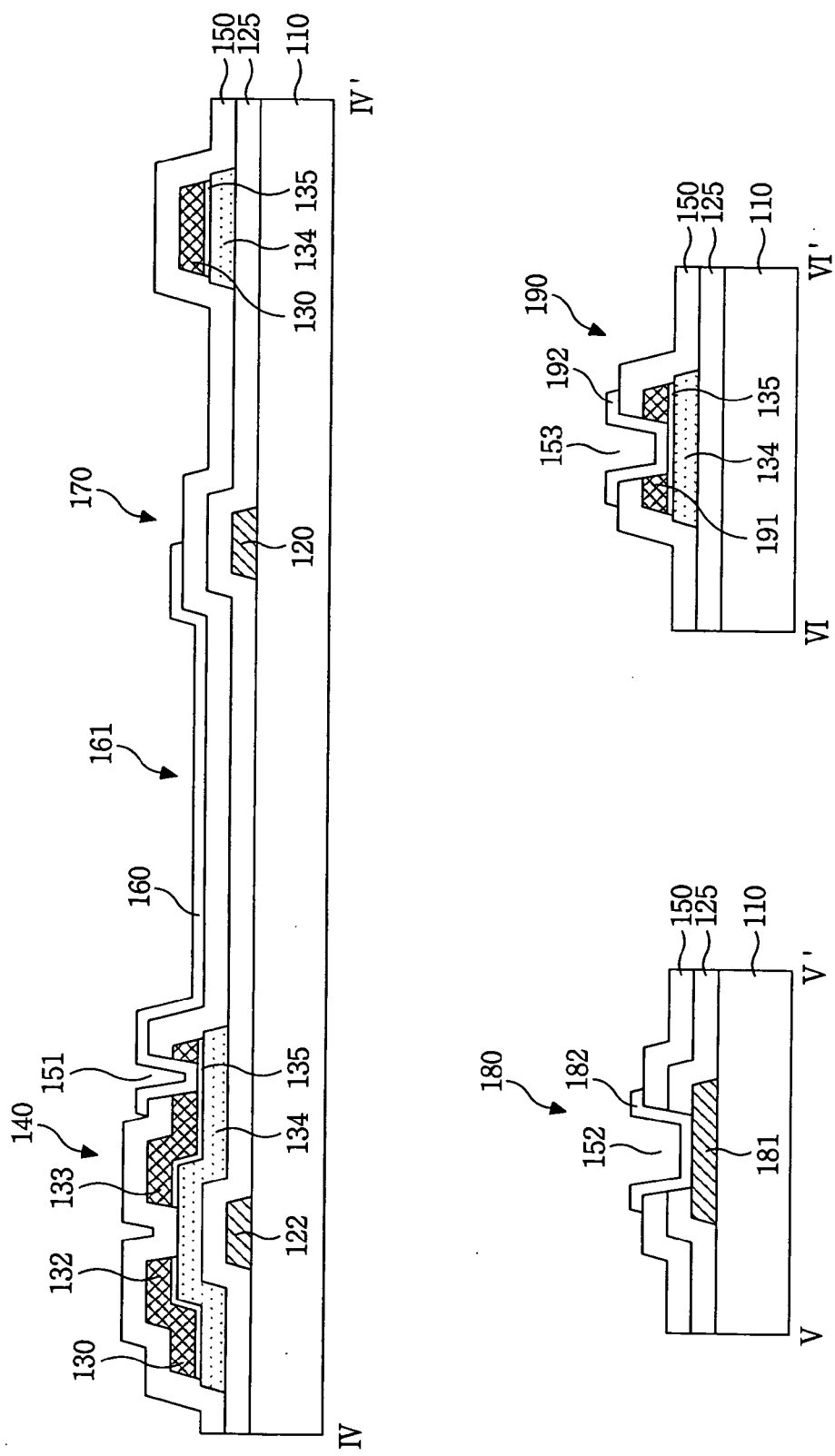

METHOD FOR FABRICATING THIN FILM TRANSISTOR SUBSTRATE

This application claims the benefit of the Korean Patent Application No. P05-0133543 filed on Dec. 29, 2005, which is hereby incorporated by reference for all purposes as if fully set forth herein.

BACKGROUND OF THE INVENTION

1. Field of the Invention

The present invention relates to a fabricating method of a thin film transistor substrate. More particularly the present invention relates to a fabricating method of a thin film transistor substrate that is adaptive for forming a good pattern design and removing a stepped difference at the same time using a three-mask process.

2. Description of the Related Art

A liquid crystal display device controls the light transmittance of liquid crystal by use of an applied electric field, thereby displaying a picture. The liquid crystal display device drives the liquid crystal by the electric field formed between a common electrode and a pixel electrode which are disposed to face each other in upper and lower substrates.

The liquid crystal display device includes a thin film transistor substrate and a color filter substrate which are bonded to face each other; a spacer for fixedly keeping a cell gap between two substrates; and a liquid crystal filled in the cell gap.

The thin film transistor substrate includes a plurality of signal lines, thin film transistors and an alignment film which is spread thereon for aligning liquid crystal. A color filter array substrate includes a color filter for realizing color; a black matrix for preventing light leakage; and an alignment film which is spread thereon for aligning liquid crystal.

In such a liquid crystal display device, a thin film transistor array substrate includes a semiconductor process and requires a plurality of mask processes. Thus, the fabrication process is complicated and is a major factor for the increased fabrication costs of the liquid crystal panel.

In order to solve the problem as described above, the thin film transistor substrate is developed in a direction of reducing the number of mask processes. One mask process includes a lot of sub-processes such as a thin film deposition process, a cleaning process, a photolithography process, an etching process, a photo-resist peeling process, an inspection process, etc.

Accordingly, use of a three-mask process has recently been on the rise, wherein the three-mask process uses a lift-off method or passiless method by which one mask process can be reduced from a five mask or four mask process which was a standard mask process of the thin film transistor substrate.

In reference to FIGS. 1 and 2, the structure and operation of the thin film transistor substrate which is fabricated by the related art three-mask process will be explained.

Referring to FIGS. 1 and 2, a thin film transistor substrate fabricated by the related art three-mask process includes a gate line 20 formed on a substrate 10; a data line 30 which crosses the gate line 20 with a gate insulating film 25 therebetween to define a pixel area 61; a thin film transistor 40 formed at each crossing part thereof; a pixel electrode 60 formed at the pixel area 61 to be connected to the thin film transistor 40; a storage capacitor 70 formed at an overlapping part of the gate line 20 and the storage electrode 65; a gate pad 80 connected to the gate line 20; and a data pad 90 connected to the data line 30.

Herein, the thin film transistor 40 acts to charge the pixel electrode 60 with a pixel signal of the data line 30 in response to a gate signal of the gate line 20, and includes a gate electrode 22 connected to the gate line 20, a source electrode 32 connected to the data line 30 and a drain electrode 33 which faces the source electrode 32 with a channel therebetween and has its side connected to the pixel electrode 60.

Herein, the thin film transistor 40 further includes an active layer 34 which is formed to overlap the gate electrode 22 with a gate insulating film 25 therebetween to form a channel between the source electrode 32 and the drain electrode 33, and an ohmic contact layer 35 formed on the active layer 34 except a channel part for making the active layer 34 in ohmic contact with the source electrode 32 and the drain electrode 33.

At this moment, the active layer 34 and the ohmic contact layer 35 are formed to overlap the data line 30, a data pad lower electrode 91 and a storage electrode 65.

A passivation film 50 covers the thin film transistor 40 formed on a gate insulating film 25 and acts to protect the active layer 34 which forms the channel from moisture or a scratch which might be generated in the following process.

The pixel electrode 60 is formed in a pixel hole 61 of a pixel area defined by the crossing of the gate line 20 and the data line 30, and the pixel electrode 60 is formed to make a boundary with the passivation film 50 while being in side-contact with the drain electrode 33 of the thin film transistor 40.

More specifically, the pixel electrode 60 is side-connected to the drain electrode 33 which is partially etched when forming the pixel hole 62 that penetrates the passivation film 50 and the gate insulating film 25, and is formed to overlap a part of the active layer which is exposed by the etched drain electrode 33 or to be in side-contact with the gate insulating film 25.

An electric field is formed between the pixel electrode 60 to which the pixel signal is supplied through the thin film transistor 40 and a common electrode (not shown) to which a reference voltage supplied.

Accordingly, the electric field formed between the pixel electrode 60 and the common electrode rotates liquid crystal molecules filled between the thin film transistor substrate and the color filter substrate by a dielectric anisotropy, and makes the transmittance of the light transmitted through the pixel area changed in accordance with the rotation degree of the liquid crystal molecules, thereby realizing the gray level.

The storage capacitor 70 includes the gate line 20, and a storage electrode 65 which overlaps the gate line 20 with the gate insulating film 25, the active layer 34 and the ohmic contact layer 35 therebetween. Herein, the pixel electrode 60 formed to make a boundary with the passivation film 50 within the pixel hole 61 is connected to the side of the storage electrode 65. The storage capacitor 70 makes the pixel signal which is charged in the pixel electrode stably kept until the next pixel signal is charged.

The gate pad 80 is connected to a gate driver (not shown) to supply the gate signal to the gate line 20. The gate pad 80 includes a gate pad lower electrode 81 extended from the gate line 20, and a gate pad upper electrode 82 which is connected to the gate pad lower electrode 81 through the inner surface of a first contact hole 51 that penetrates the gate insulating film 25 and the passivation film 50.

The data pad 90 is connected to the data driver (not shown) to supply a data signal to the data line 30. The data pad 90 includes a data pad lower electrode 91 extended from the data line 30, and a data pad upper electrode 92 which is connected to the data pad lower electrode 91 through the inner surface of a second contact hole 53 that penetrates the passivation film 50.

At this moment, the data pad upper electrode 92 is in contact with the gate insulating film 25 or with the remaining active layer 34 as the ohmic contact layer 35 and the active layer 34 which constitute the data pad lower electrode 91 are etched when forming the second contact hole 52.

Hereinafter, a method of fabricating a thin film transistor substrate using a related art three-mask process will be described in detail with reference to the FIG. 3A to 3L.

First, a first conductive pattern including a gate line 20, a gate electrode 22 and a lower gate pad electrode 81 are formed on a lower substrate 10 using a first mask process, as shown in FIG. 3A.

More specifically, a gate metal layer is formed on the lower substrate 10 by a deposition technique such as a sputtering, etc.

A photo-resist is spread over the entire surface of the gate metal layer, a photolithography process using a first mask is performed, thereby forming a first conductive pattern inclusive of the gate line 20, the gate electrode 22 connected to the gate line and the gate pad lower electrode 81 on a lower substrate 10.

As described above, after forming the first conductive pattern on the lower substrate 10, a second conductive pattern and a semiconductor pattern forming a channel are formed on the gate insulating film 25 by a second mask process.

To describe this more specifically, as shown in FIG. 3B, the gate insulating film 25, an amorphous silicon layer 34A, an n+ amorphous silicon layer 35A and a data metal layer 30A are sequentially formed by a deposition method such as PECVD, sputtering, etc on the lower substrate 10 where the first conductive pattern is formed.

Herein, the metal forming the data metal layer 30A is a metal that can be etched together with an exposed part when etching the passivation film 50 in the following process, e.g., Mo, Cu group, Al group, Cr group, etc which can be dry-etched.

Then, after the photo-resist is spread over the entire surface of the data metal layer 30A, the photolithography process using a second mask being a diffractive exposure mask is performed, thereby forming a photo-resist pattern PR having a stepped difference on the data metal layer 30A, as shown in FIG. 3C.

A halftone mask of which a diffractive exposure part corresponds to a channel area of the thin film transistor 40 is used as the second mask, thus the photo-resist pattern formed in the channel area is formed to have lower height than the photo-resist pattern formed in the other area.

As described above, after forming the photo-resist pattern having a deviation on the data metal layer 30A, the data metal layer 30A exposed by the photo-resist pattern is removed by a wet etching, as shown in FIG. 3D.

Then, the amorphous silicon layer 34A and the n+ amorphous silicon layer 35A exposed as the data metal layer 30A is removed by the wet etching are sequentially removed by the dry etching.

As described above, after sequentially removing the n+ amorphous silicon layer 35A and the amorphous silicon layer 34A, the photo-resist pattern is removed by an ashing process using oxygen $O_2$ plasma, thereby exposing the data metal layer 30A formed in the channel area, as shown in FIG. 3E.

The data metal layer 30A formed in the shielding area is also exposed as the photo-resist pattern corresponding to the shielding part of the diffractive exposure mask is removed by the ashing process using the oxygen $O_2$ plasma.

Then, the data metal layer 31 exposed in the channel area and the shielding area is removed by the dry etching, thereby forming the data line 30, the source electrode 32 connected to the data line 30, the drain electrode which faces and is separated from the source electrode 32, the data pad lower electrode 91 and the storage electrode 65, as shown in FIG. 3F.

The storage electrode 65 is formed to overlap the gate line 20 with the gate insulating film 25 and the semiconductor pattern therebetween, and the n+ amorphous silicon layer 35A formed in the channel area is opened as the source electrode 32 is separated from the drain electrode 33.

As described above, the n+ amorphous silicon layer 35A opened in the channel area is removed by the dry etching, thereby sequentially forming the active layer 34 and the ohmic contact layer which form a channel of the thin film transistor 40, as shown in FIG. 3G.

Then, the photo-resist pattern remaining on the gate insulating film 25 is removed, thereby forming the semiconductor pattern inclusive of the ohmic contact layer 35 and the active layer 34 for forming the channel; and the second conductive pattern inclusive of the data line 30, the source electrode 32 connected to the data line 30, the drain electrode 33 which corresponds to the source electrode 32 with the channel therebetween, the storage electrode 65 and the data pad lower electrode 91, as shown in FIG. 3H.

As described above, after forming the semiconductor pattern and the second conductive pattern on the gate insulating film 25, the passivation film 50 and a third conductive pattern are formed on the gate insulating film 25 by the lift-off process using a third mask.

To describe this more specifically, after depositing the passivation film 50 on the entire surface of the gate insulating film 25 where the semiconductor pattern and the second conductive pattern are formed, the photolithography process using the third mask is performed, thereby forming a photo-resist pattern which is for forming first and second contact holes 51, 52 and the pixel hole 61 on the passivation film 50, as shown in FIG. 3I.

As described above, after forming the photo-resist pattern on the passivation film 50, the gate insulating film 25 and the passivation film 50 exposed by the photo-resist pattern are sequentially removed by the dry etching, thereby forming the first and second contact holes 51, 52 and the pixel hole 61 where the pixel electrode is to be deposited, as shown in FIG. 3J.

The first contact hole 51 penetrates the passivation film 50 and the gate insulating film 25 to expose the gate pad lower electrode 81, and the second contact hole 52 penetrates the passivation film 25 to expose the data pad lower electrode 91.

And the pixel hole 61 penetrates the passivation film 50 and the gate insulating film 25 formed in the pixel area 60 to expose the lower substrate 10. At this moment, the active layer 34 and the ohmic contact layer 35 overlapped with the drain electrode 33 are sequentially etched as the side of the drain electrode exposed when the dry etching for forming the pixel hole 62 is performed is etched.

As described above, after forming the first and second contact holes 51, 52 and the pixel hole 61 on the passivation film 50 by use of the photo-resist pattern, a transparent conductive film 60A is deposited on the entire surface of the lower substrate 10 where the photo-resist pattern is formed by use of the sputtering method, etc, as shown in FIG. 3K.

At this moment, an undercut area 'A' is generated between the transparent conductive film 60A formed on the passivation film 50 and the transparent conductive film 60B formed in the pixel hole 61 area.

Then, after removing the photo-resist pattern formed on the passivation film 50 by the etching process using the undercut area 'A', the transparent conductive film 60A formed on the photo-resist pattern by the lift-off process is removed, thereby forming the third conductive pattern inclusive of the pixel electrode 60, the gate pad upper electrode 82, the data pad upper electrode 92, as shown in FIG. 3L.

At this moment, the pixel electrode 60 is formed to make a boundary with the passivation film 50 within the pixel hole 61 and is connected to the side of the drain electrode 33.

And, the gate pad upper electrode 82 forms a side boundary with the gate insulating film 25 and the passivation film 50 which are patterned within the first contact hole 51, and the gate pad upper electrode 82 is connected to the gate pad lower electrode 81.

Further, the data pad upper electrode 92 forms a boundary with the passivation film 50 within the second contact hole 52 and is side-connected to the data pad lower electrode 92.

As described above, in a case of fabricating the thin film transistor substrate by the lift-off process using the third mask, there is a problem in that an area 'B' where no undercut is generated is formed as the transparent conductive film 60A formed on the passivation film 50 and the transparent conductive film 60B formed in the pixel hole 61 are short-circuited, as shown in FIG. 4.

Further, in a case in which impurities are present while the transparent conductive film 60A is formed on the passivation film 50 and the transparent conductive film 60B formed in the pixel hole 61 are short-circuited, an etching solution for stripping the photo-resist pattern permeates along the path through which the impurities are present, thus there is a problem that there is generated an area 'C' where a part of the transparent conductive film 60B formed in the pixel hole 61 is lost, as shown in FIG. 5.

SUMMARY OF THE INVENTION

Accordingly, the present invention is directed to a method for fabricating a thin film transistor substrate that substantially obviates one or more of the problems due to limitations and disadvantages of the related art.

An advantage of the present invention is to provide a method of fabricating a thin film transistor substrate that is adaptive for forming a good pattern design and removing a stepped difference at the same time by a three-mask process.

In order to achieve this and other advantages of the invention, a fabricating method of a thin film transistor substrate according to an aspect of the present invention includes forming a gate line on a substrate; forming a data line which crosses the gate line with a gate insulating film therebetween, wherein the crossing of the data and gate lines form pixel regions; forming a thin film transistor at the crossing part of the gate line and the data line; forming a passivation film on the gate insulating film; after forming the passivation film, forming a first photo-resist pattern in the pixel regions; depositing a transparent conductive film on an entire surface of the passivation film where the first photo-resist pattern is formed in the pixel region; and removing the first and second photo-resist patterns which remain on the passivation film after etching the transparent conductive film which is exposed by the second photo-resist pattern.

A fabricating method of a thin film transistor substrate according to another aspect of the present invention includes forming a first conductive pattern inclusive of a gate line, a gate electrode connected to the gate line and a gate pad lower electrode on a substrate; forming a semiconductor pattern that forms a channel on a gate insulating film which covers the substrate and a second conductive pattern inclusive of a data line, a source electrode connected to the data line, a drain electrode which faces the source electrode with a channel therebetween and a data pad lower electrode; forming a passivation film on the gate insulating film; forming a first photo-resist pattern for opening and exposing a passivation area where a contact hole and a pixel electrode are to be formed; depositing the transparent conductive film on the entire surface of the passivation film where the first photo-resist is formed; forming a second photo-resist pattern that exposes the transparent conductive film formed in an area other than the passivation film area; removing the transparent conductive film exposed by the second photo-resist pattern; and forming a third conductive pattern inclusive of the passivation film where the contact hole is formed by removing the first and second photo-resist patterns which remain on the passivation film, a pixel electrode, a gate pad upper electrode and a data pad upper electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawing, which are included to provide a further understanding of the invention and are incorporated in and constitute apart of this specification, illustrate embodiments of the invention and together with the description serve to explain the principles.

FIGS. 3A to 3L are fabrication process diagrams of the thin film transistor substrate using a three-mask process of the related art;

FIG. 7 is a cross sectional diagram of the thin film transistor substrate taken along the line IV-IV', V-V', VI-VI' in FIG. 6;

FIGS. 8A and 8B are a plan view and a cross sectional diagram of the thin film transistor substrate where a first conductive pattern is formed by a first mask process according to the present invention;

FIGS. 9A to 9C are fabrication process diagrams of the thin film transistor substrate where the first conductive pattern is formed according to the present invention;

FIGS. 11A to 11H are fabrication process diagrams of the thin film transistor substrate where the second conductive pattern and the semiconductor pattern are formed according to the present invention;

FIGS. 12A and 12B are a plan view and a cross sectional diagram of the thin film transistor substrate where a third conductive pattern and a passivation film where a plurality of contact holes are formed are formed by a third mask process according to the present invention; and FIGS. 13A to 13I are fabrication process diagrams of the thin film transistor substrate where the third conductive pattern and the passivation film are formed according to the present invention.

DETAILED DESCRIPTION OF THE ILLUSTRATED EMBODIMENTS

Reference will now be made in detail to embodiments of the present invention, examples of which are illustrated in the accompanying drawings.

Figure 1:
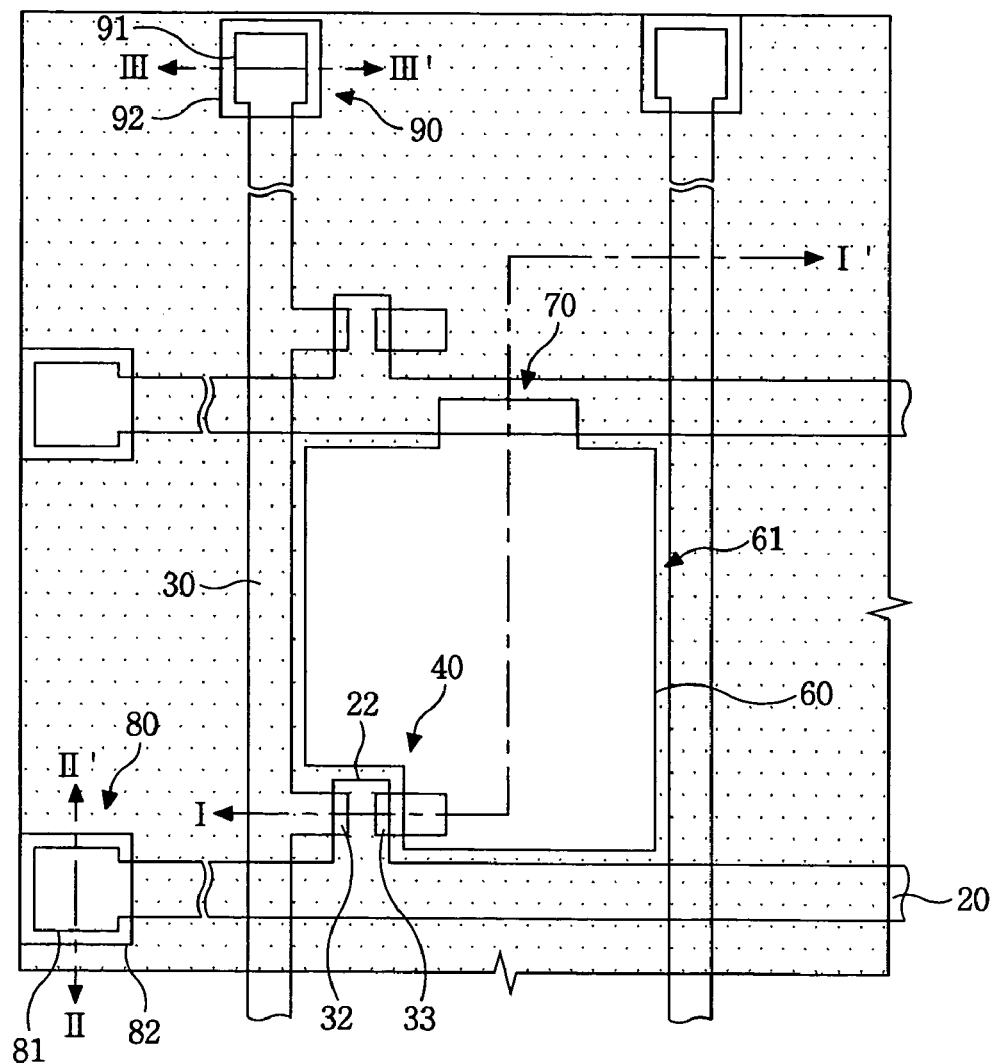
FIG. 1 is a plan view of a thin film transistor substrate which constitutes a liquid crystal display panel of the related art.
Figure 2:
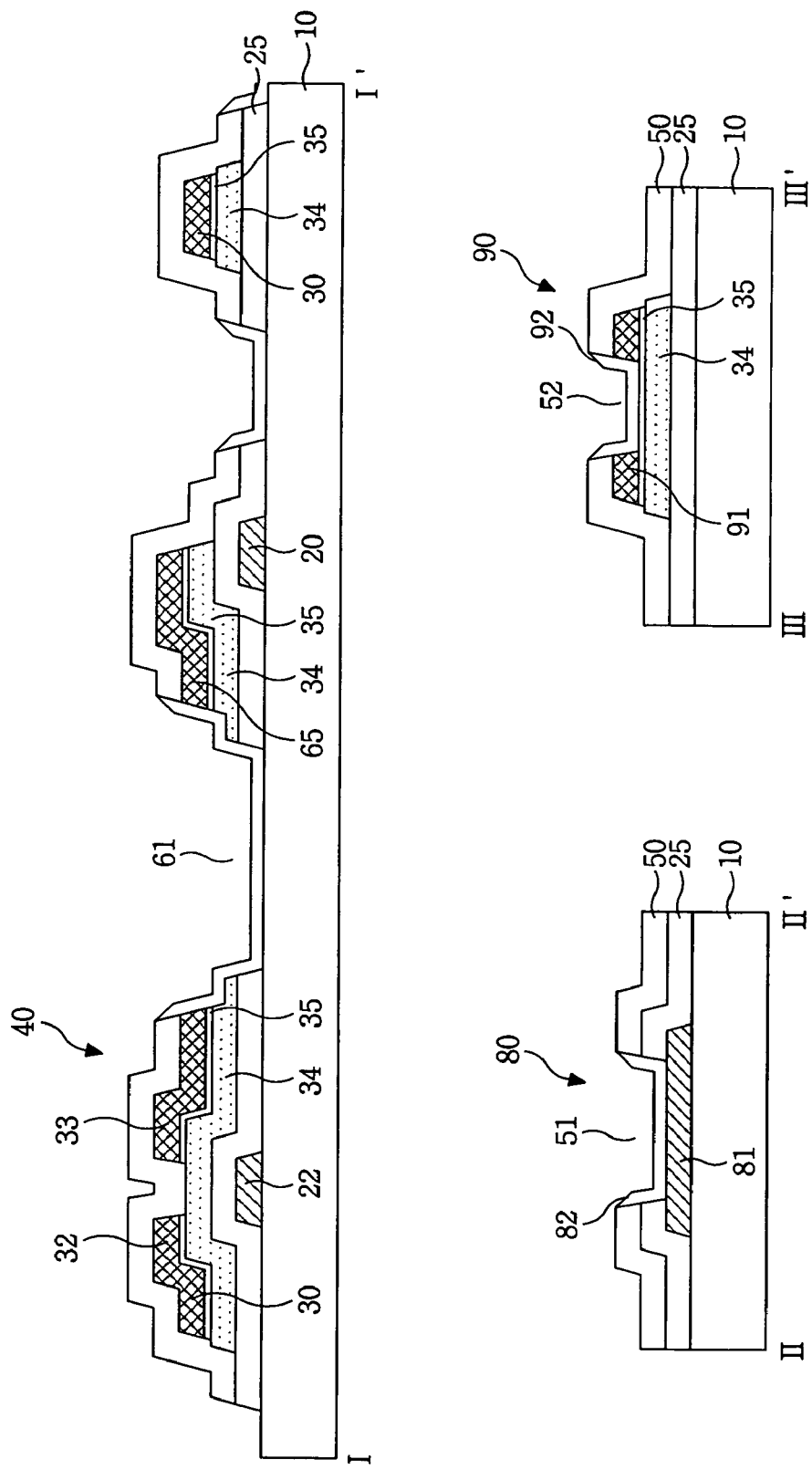
FIG. 2 is a cross sectional diagram of the thin film transistor substrate taken along the lines I-I', II-II', III-III' in FIG. 1.
Figure 3B:
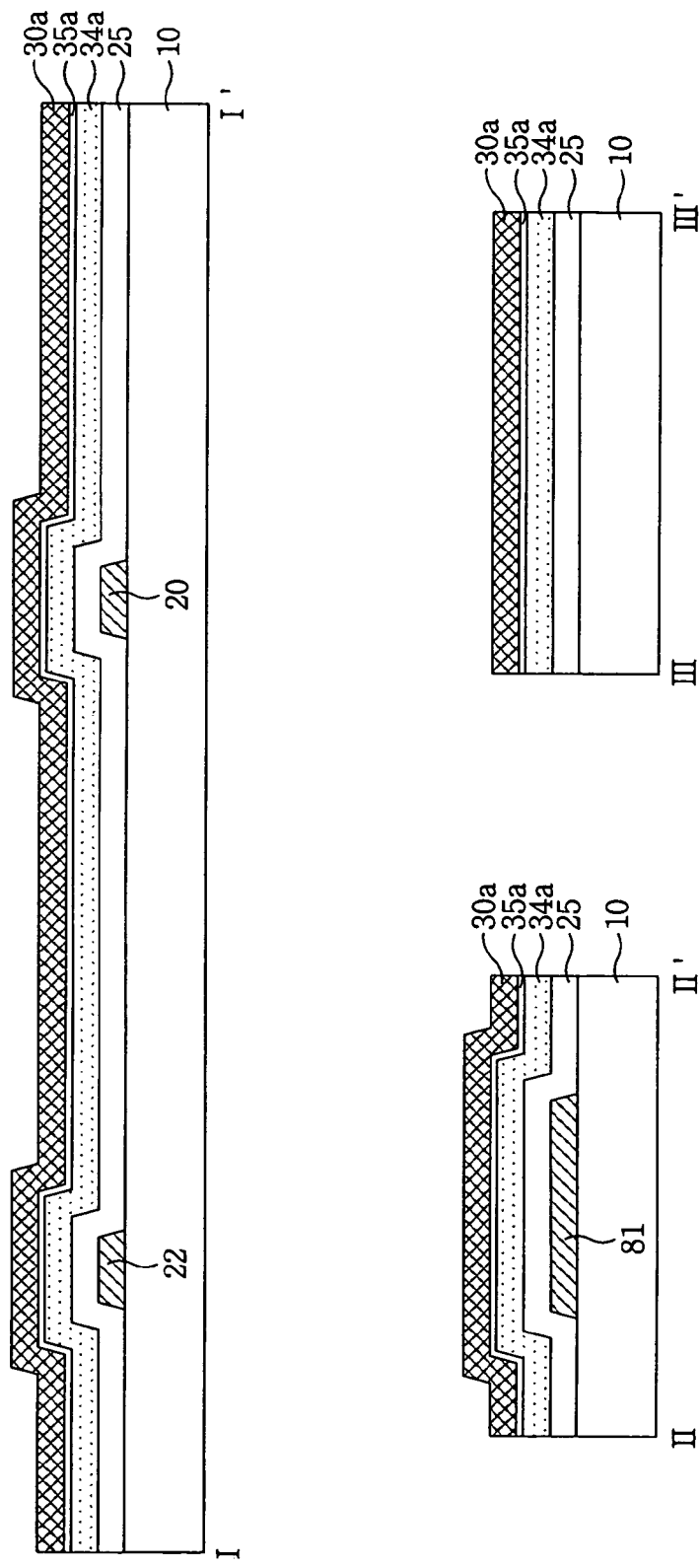
Figure 3C:
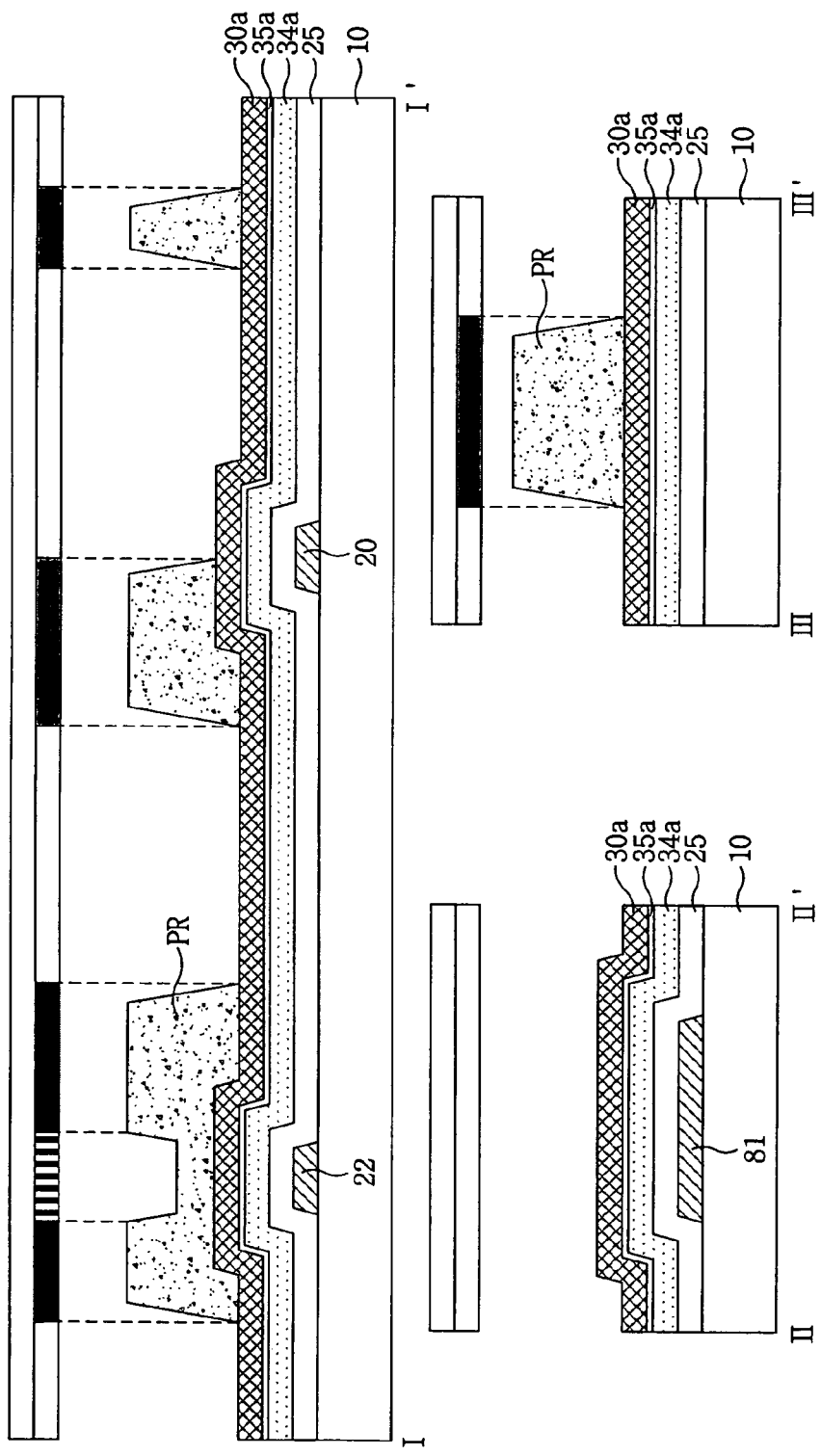
Figure 3D:
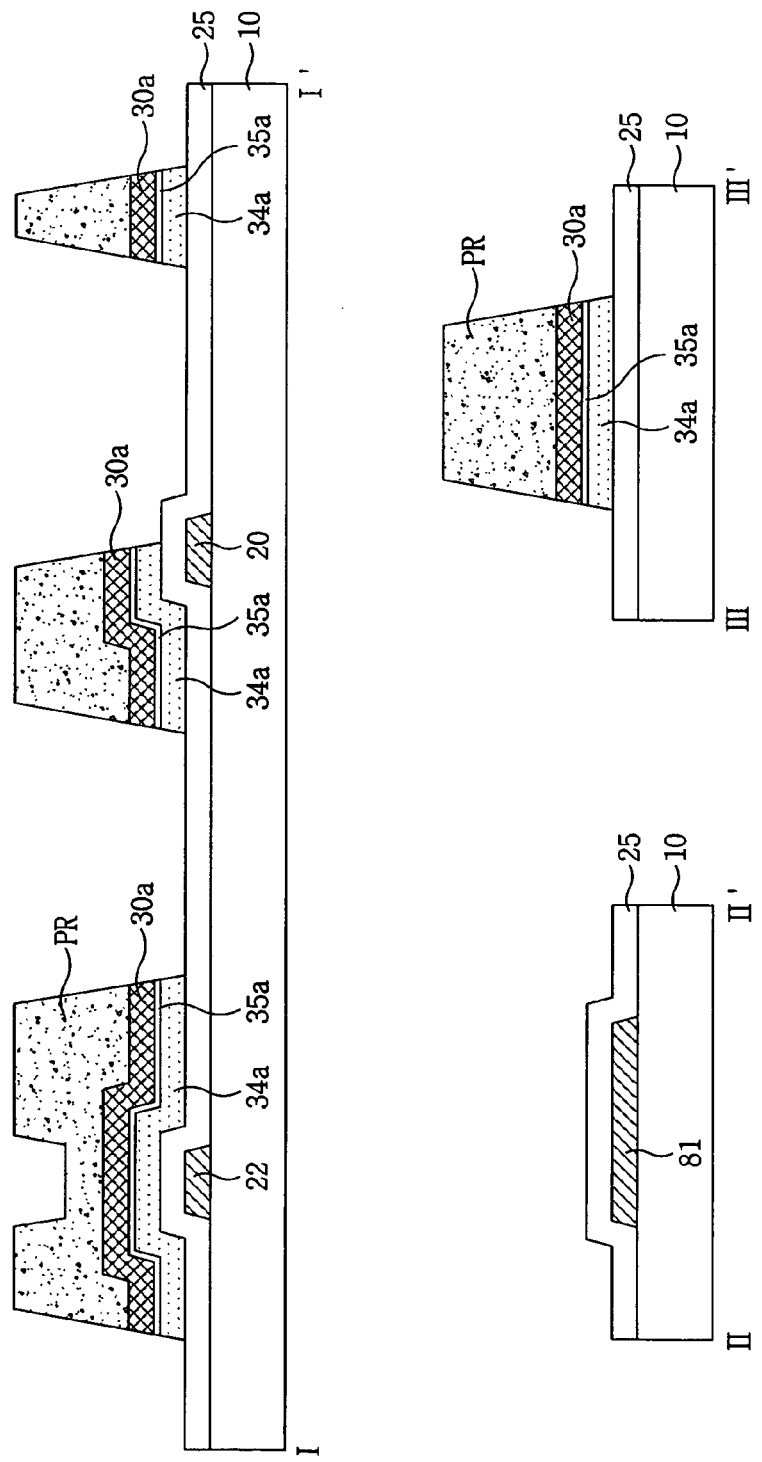
Figure 3E:
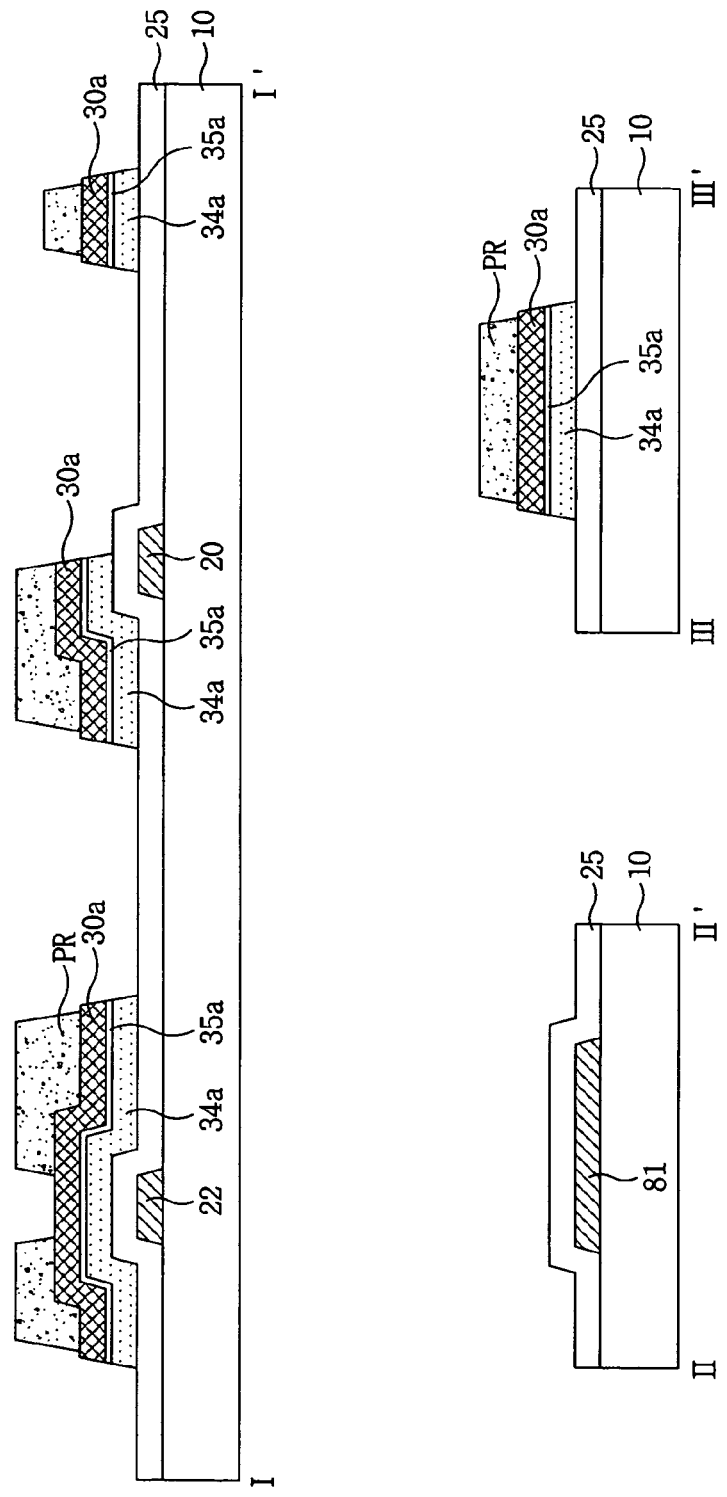
Figure 3G:
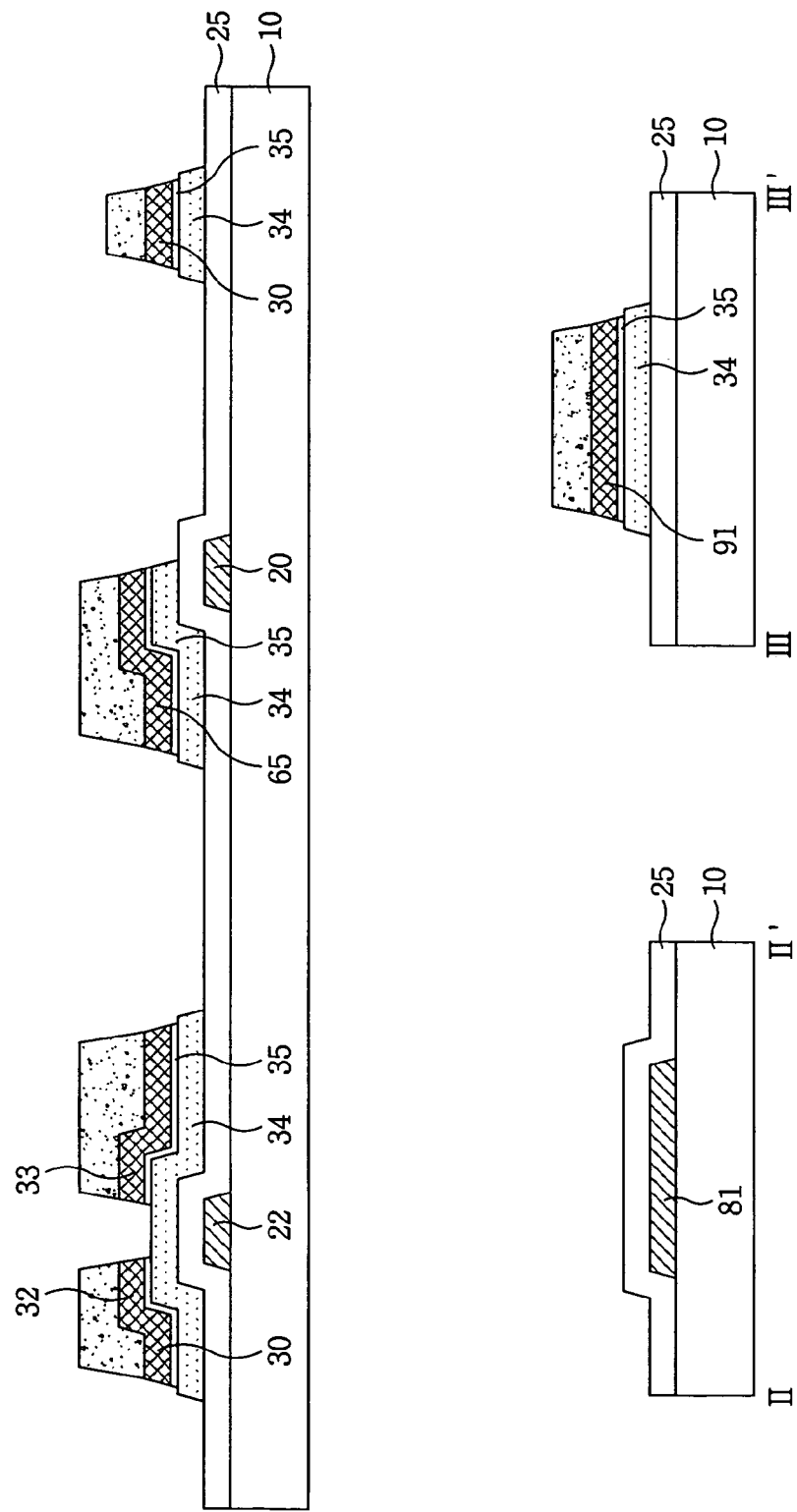
Figure 3I:
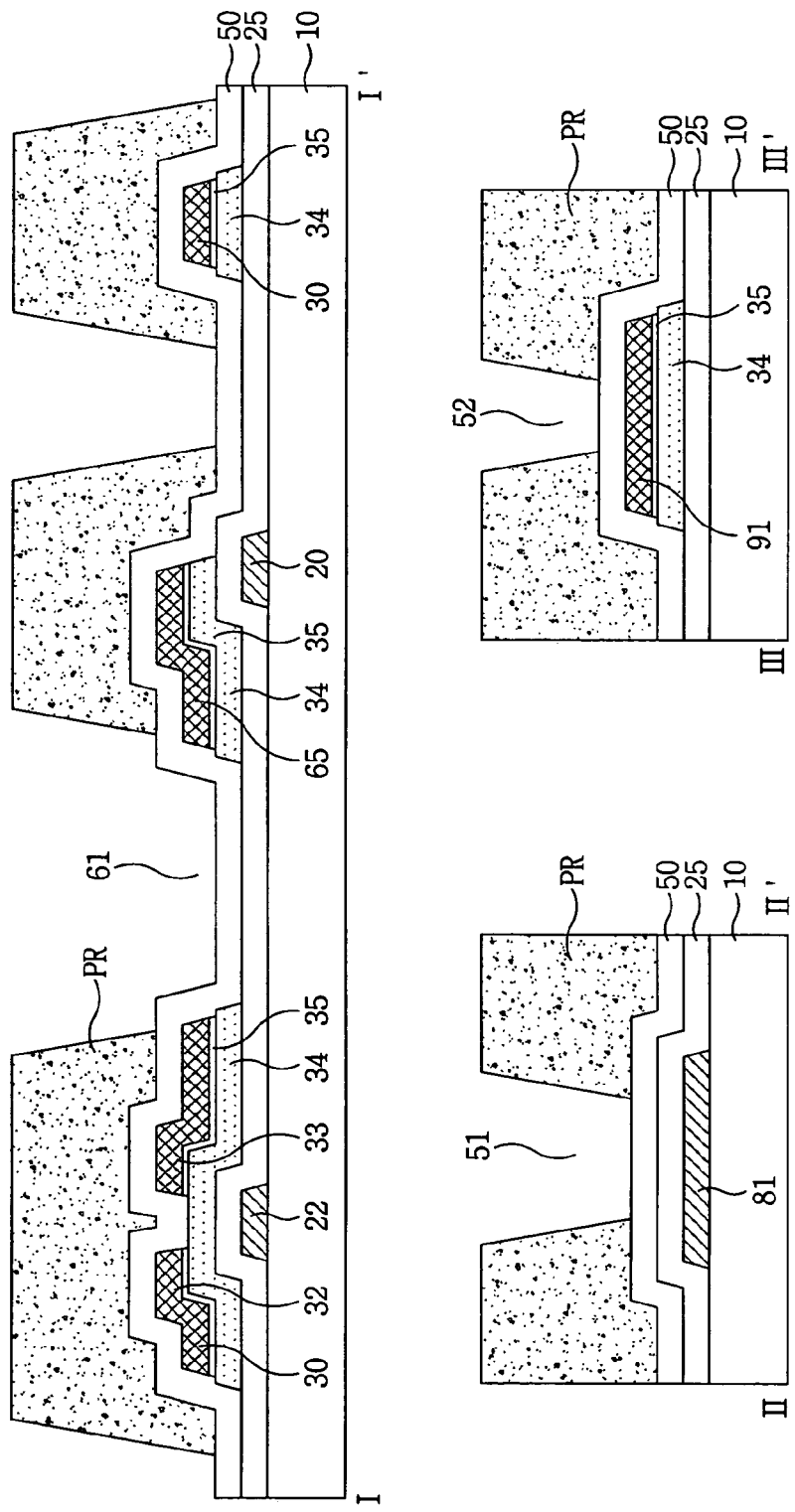
Figure 3K:
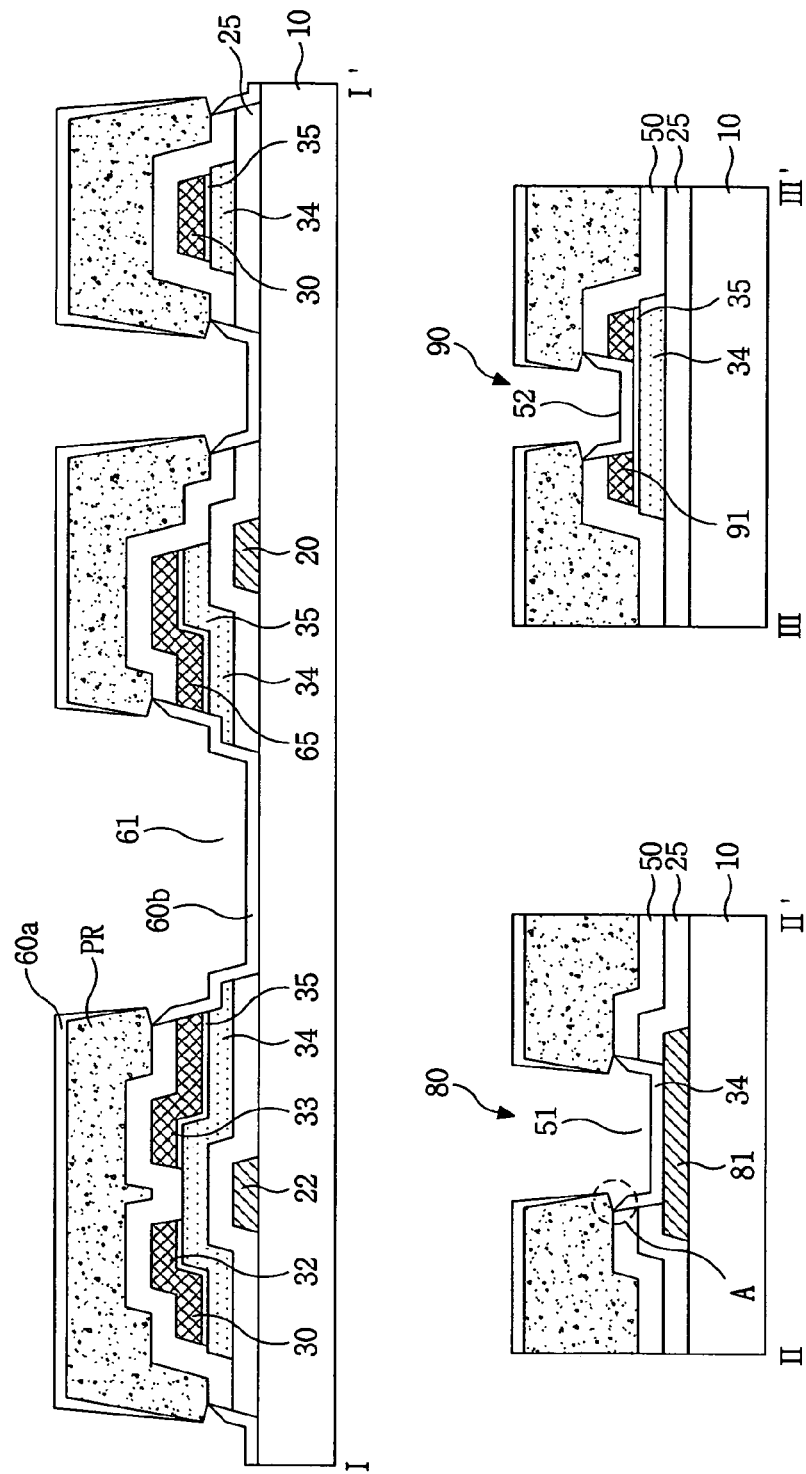
Figure 3L:
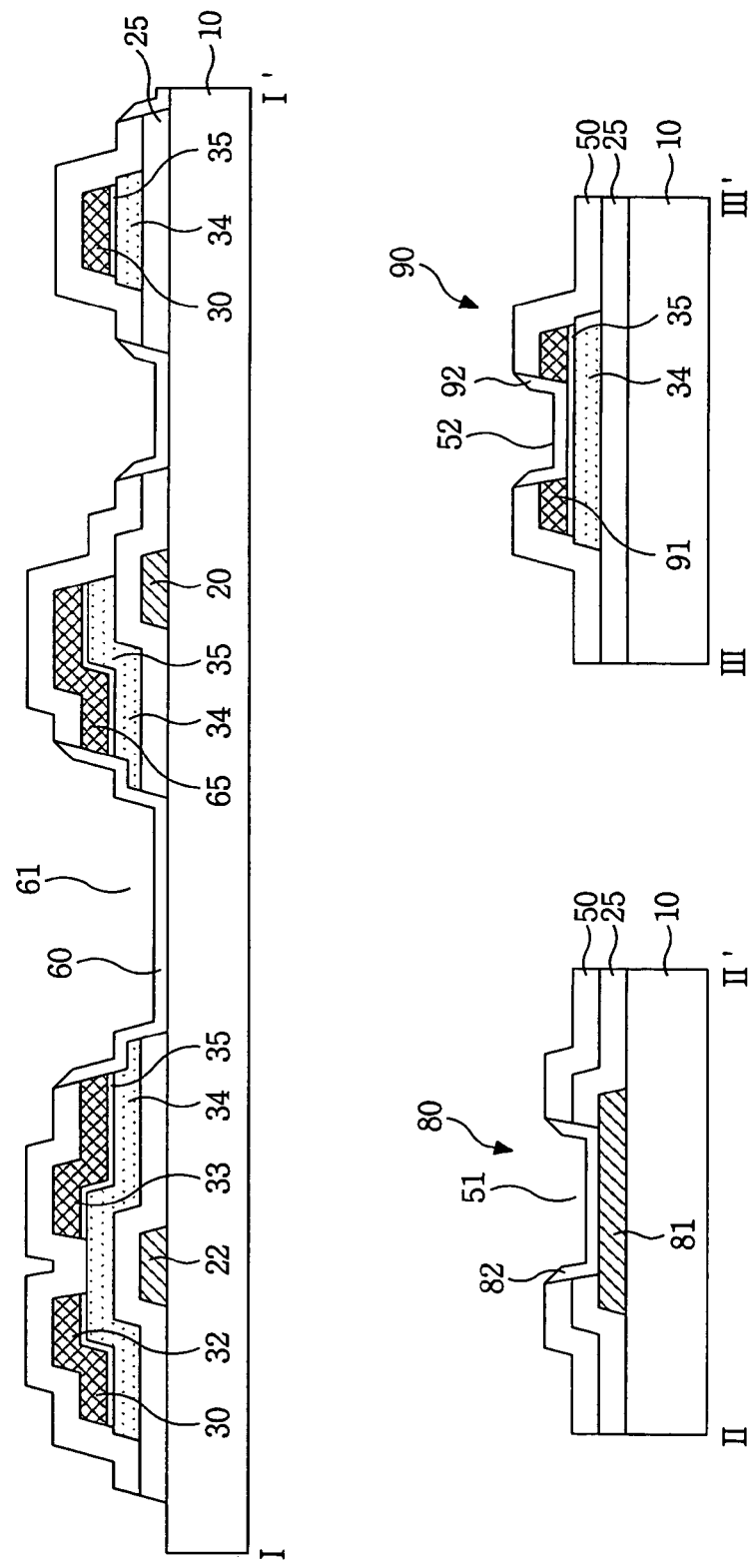
Figure 4:
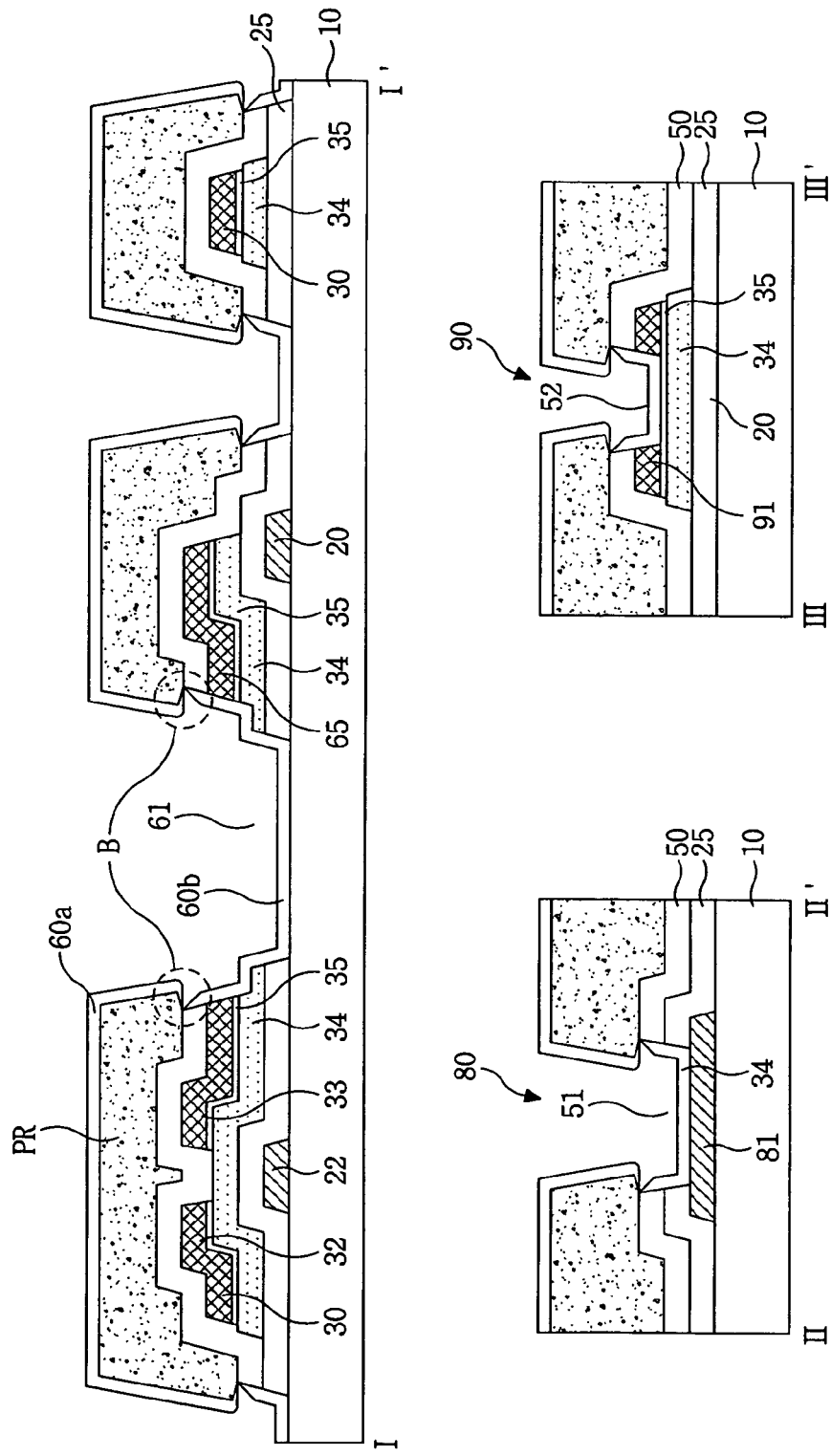
FIGS. 4 and 5 are diagrams explaining a defect of a pattern design generated in the three-mask process of the related art.
Figure 5:
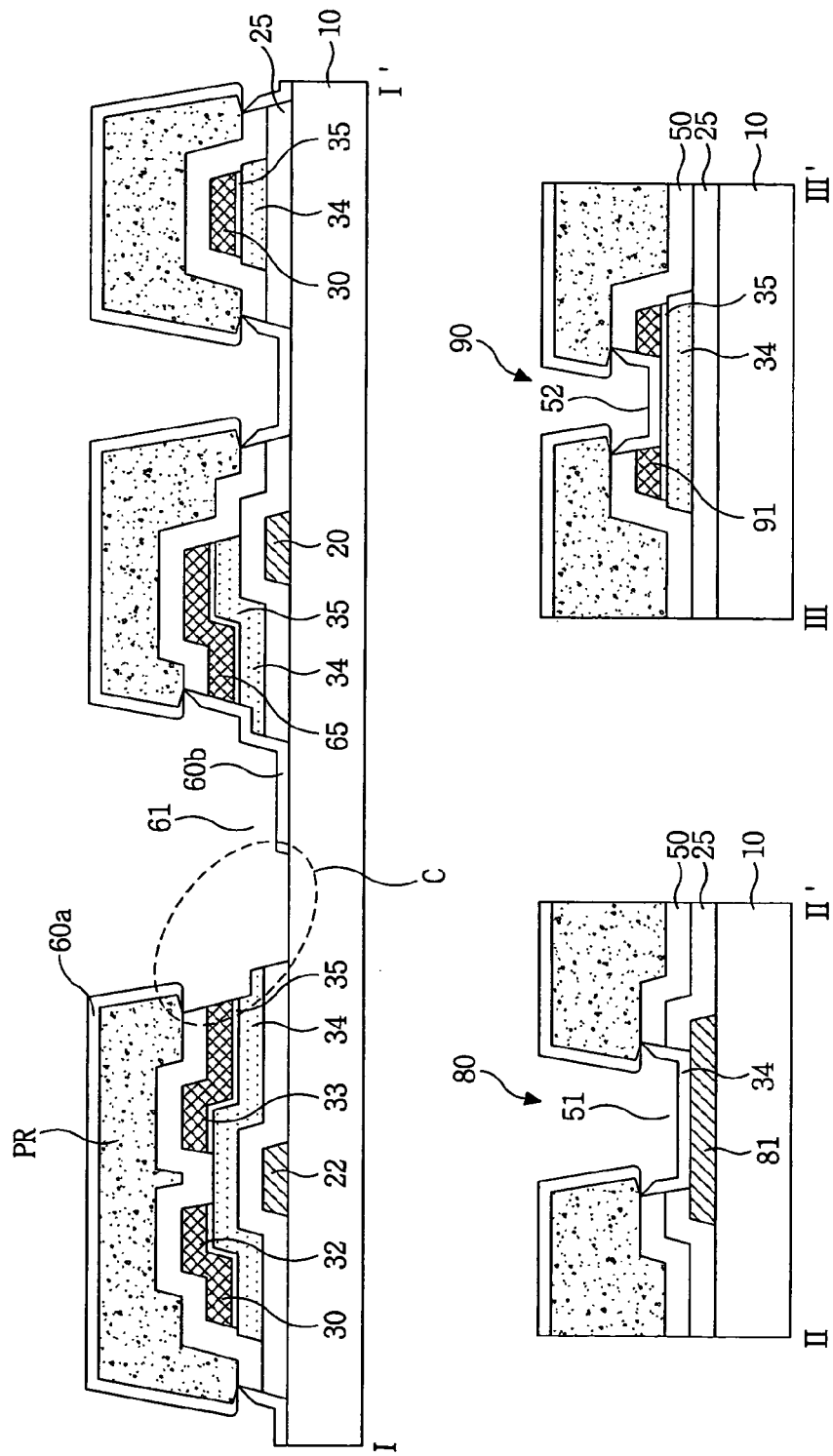
Figure 6:
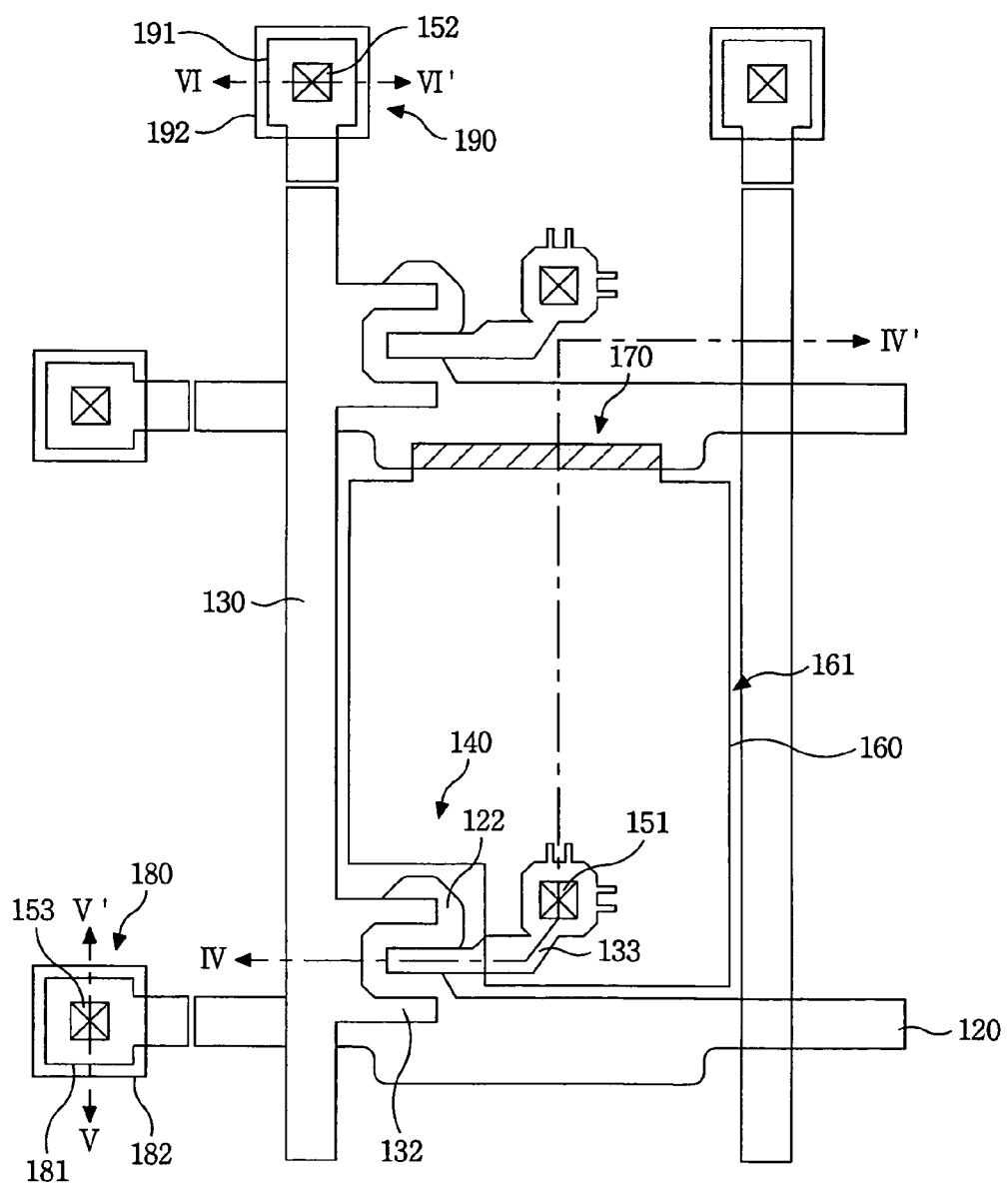
FIG. 6 is a plan view of a thin film transistor substrate which constitutes a liquid crystal display panel according to the present invention.

In FIGS. 6 and 7, a thin film transistor substrate according to the present invention includes a gate line 120 formed on a lower substrate 110; a data line 130 which crosses the gate line 120 with a gate insulating film 125; a thin film transistor 140 formed at each crossing part of the gate line 120 and the data line 130; a passivation film 150 which covers the thin film transistor formed on the gate insulating film 125; a pixel electrode 160 which penetrates the passivation film 150 to be connected to the thin film transistor 140; and a storage capacitor 170 formed at an overlapping part of the pixel electrode 160 and the gate line 120.

The thin film transistor according to the present invention further includes a gate pad 180 connected to the gate line 110, and a data pad 190 connected to the data line 130.

Herein, the gate line 120 transmits a gate signal supplied from a gate driver (not shown) connected to the gate pad 180 to the gate electrode 122 which constitutes the thin film transistor 140.

The data line 130 performs the role of transmitting the data signal supplied from a data driver (not shown) connected to the data pad 190 to the source electrode 132 and the drain electrode 133 which constitute the thin film transistor 140 in conjunction with the on/off of the gate electrode 122.

The thin film transistor 140 performs the role of charging the pixel electrode 160 with a pixel signal of the data line 130 in response to the gate signal of the gate line 120, and includes a gate electrode 122 connected to the gate line 120; a source electrode 132 connected to the data line 130; and a drain electrode 133 that faces the source electrode 132 with a channel therebetween and that is connected to the pixel electrode 160 through a first contact hole 151 which penetrates the passivation film 150.

The thin film transistor 140 further includes an active layer 134 which is formed to overlap the gate electrode 122 with the gate insulating film 125 therebetween and which forms a channel between the source electrode 132 and the drain electrode 133; and an ohmic contact layer 135 formed on the active layer 134 except a channel area for making the active layer 134 in ohmic contact with the source electrode 132 and the drain electrode 133.

The active layer 134 and the ohmic contact layer 135 are formed to overlap the data line 130 and the data pad lower electrode 191.

The passivation film 150 covers the thin film transistor 140 formed on the gate insulating film 125, and protects the pixel area 161 and the active layer 134, which forms the channel, from moisture or a scratches which can be generated in the following process.

Herein, the passivation film 150 is deposited on the gate insulating film 125 by, for example, a sputtering or PECVD method using an inorganic insulating material such as silicon nitride SiNx, etc and an organic insulating material such as acrylic organic compound, BCB (benzocyclobutene) or PFCB (perfluorocyclobutane).

First to third contact holes 151, 152, 153 are formed in the passivation film 150 by a photolithography process using a mask. Herein, the first contact hole 151 penetrates the passivation film 150 to expose the drain electrode 133, and the second contact hole 152 penetrates the passivation film 150 and the gate insulating film 125 to expose the gate pad lower electrode 181, and the third contact hole 153 penetrates the passivation film 150 to expose the data pad lower electrode 191.

The pixel electrode 160 is formed in the pixel hole 162 of the pixel area 161 to be connected to the drain electrode 133 of the thin film transistor 140 through the first contact hole 151 which penetrates the passivation film 150. An electric field is formed between the pixel electrode 160 to which the pixel signal is supplied through the thin film transistor 140 and a common electrode (not shown) to which a reference voltage is supplied.

Accordingly, the electric field formed between the pixel electrode 160 and the common electrode causes liquid crystal molecules filled between the substrates to rotate by dielectric anisotropy, and the transmittance of the light transmitted through the pixel area 161 is changed in accordance with the rotation degree of the liquid crystal molecules, thereby realizing the gray level.

The storage capacitor 170 is formed in a shape that the gate line 120 and the pixel electrode 160 overlap each other with the gate insulating film 125 and the passivation film 150 therebetween. The storage capacitor 170 maintains the pixel signal, which is charged in the pixel electrode, until the next pixel signal is charged.

The gate pad 180 is connected to the gate driver (not shown) to supply the gate signal to the gate line 120.

The gate pad 180 includes a gate pad lower electrode 181 extended from the gate line 120; a second contact hole 152 which penetrates the gate insulating film 125 and the passivation film 150; and a gate pad upper electrode 182 connected to the gate pad lower electrode 181 through the second contact hole 152.

The gate pad upper electrode 182 is formed in a shape of being projected on the gate pad 180 and the inside of the second contact hole 152, thereby performing a good electrical contact with a designated drive circuit mounted on the gate pad 180.

The data pad 190 is connected to the data driver (not shown) to supply the data signal to the data line 130.

The data pad 190 includes a data pad lower electrode 191 formed on the gate insulating film to be extended from the data line; a third contact hole 153 which penetrates the passivation film 150; and a data pad upper electrode 192 connected to the data pad lower electrode 191 through the third contact hole 153.

At this moment, the data pad upper electrode 192 is formed in a shape of being projected on the data pad 190 and the inside of the third contact hole 153, thereby performing a good electrical contact with a designated drive circuit mounted on the data pad 190.

Hereinafter, in reference to attached drawings, a fabricating method of a thin film transistor substrate according to the present invention will be explained in detail.

Figure 8A:
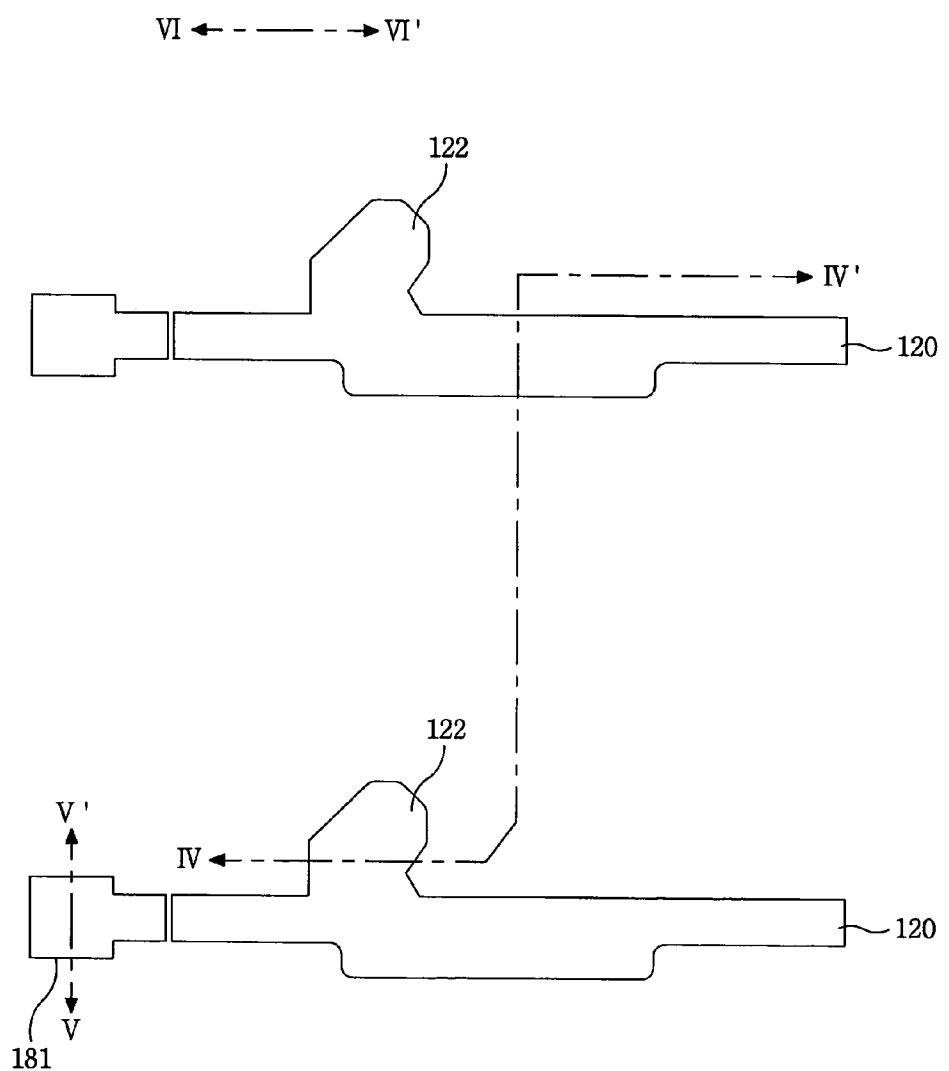

In FIGS. 8A and 8B, a process of forming a first conductive pattern of the thin film transistor substrate according to the present invention will be explained.

Referring to FIGS. 8A and 8B, a first conductive pattern inclusive of the gate line 120, the gate electrode 122 and the gate pad lower electrode 181 is formed on the lower substrate 110 by use of a first mask process.

Figure 9A:
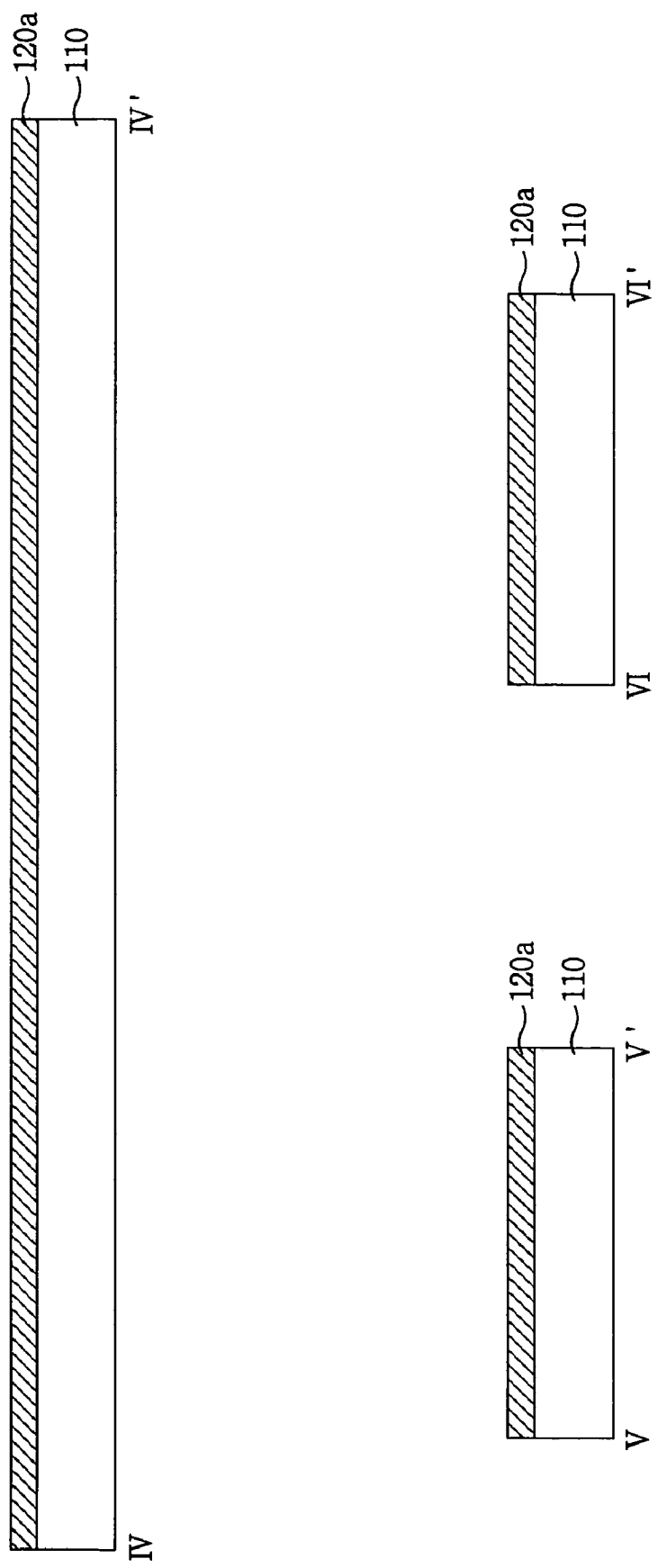

To describe this more specifically, a gate metal layer 120A is formed on the lower substrate 110 by a deposition method such as a sputtering method, etc, as shown in FIG. 9A. Herein, the gate metal layer 120A is formed of for example, aluminum AL group metal, copper Cu, chrome Cr, molybdenum Mo, etc.

In a case that the gate metal layer 120A constituting the first conductive pattern is formed of an aluminum Al group metal which is a low resistant line, the gate metal layer 120A can be formed to have a double structure such as AlNd/Mo, etc in order to improve a contact resistance with a transparent conductive film ITO which forms the third conductive pattern.

Then, after spreading a photo-resist over the gate metal layer 120A, a photolithography process using a first mask 200 is performed, thereby forming a designated photo-resist pattern 250A on the gate metal layer 120A, as shown in FIG. 9B.

At this moment, a wet etching is performed for the gate metal layer which is exposed by the photo-resist pattern 250A, thereby forming the first conductive pattern inclusive of the gate line 120, the gate electrode 122 connected to the gate line, and the gate pad lower electrode on the lower substrate 110, as shown in FIG. 9C.

Figure 10A:
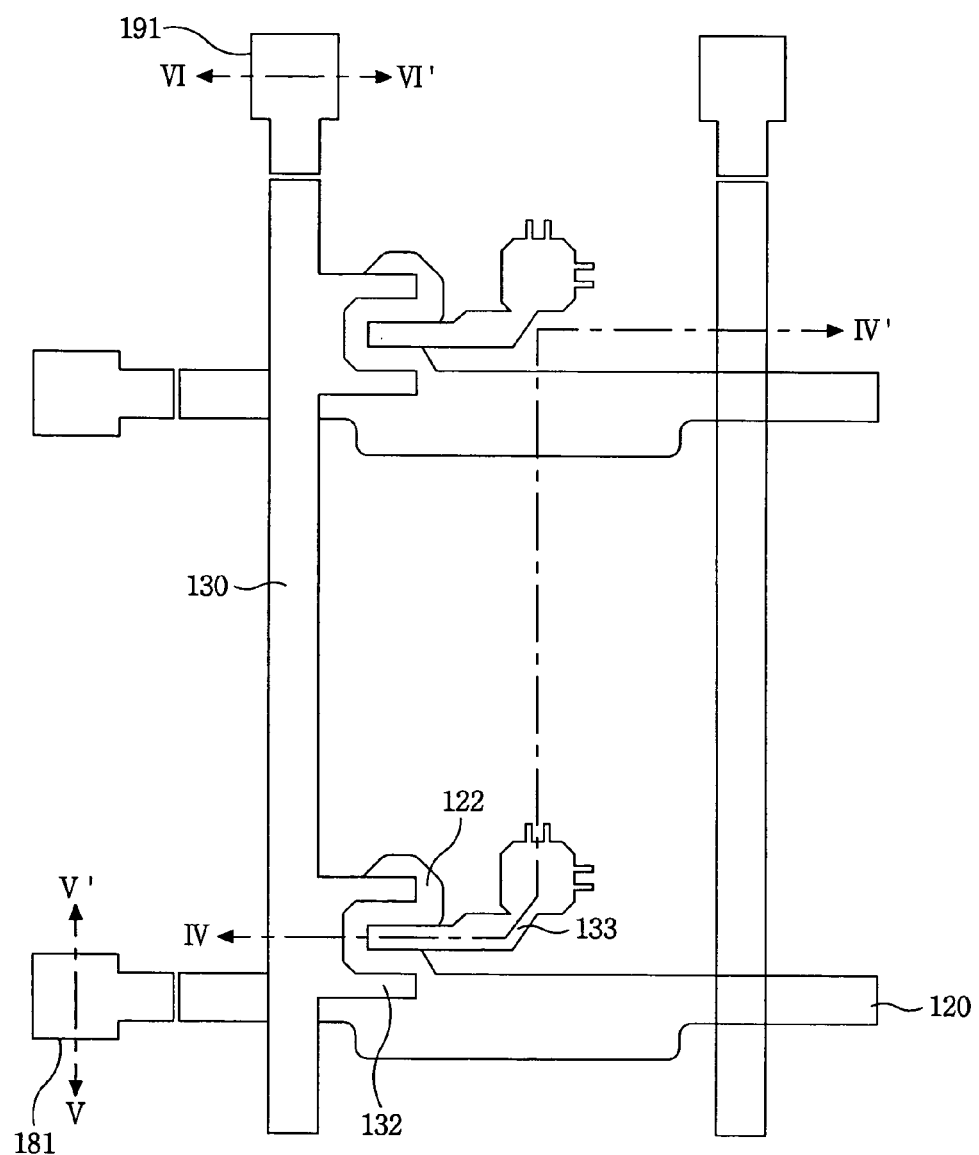
FIGS. 10A and 10B are a plan view and a cross sectional diagram of the thin film transistor substrate where a second conductive pattern and a semiconductor pattern are formed by a second mask process according to the present invention.
Figure 10B:
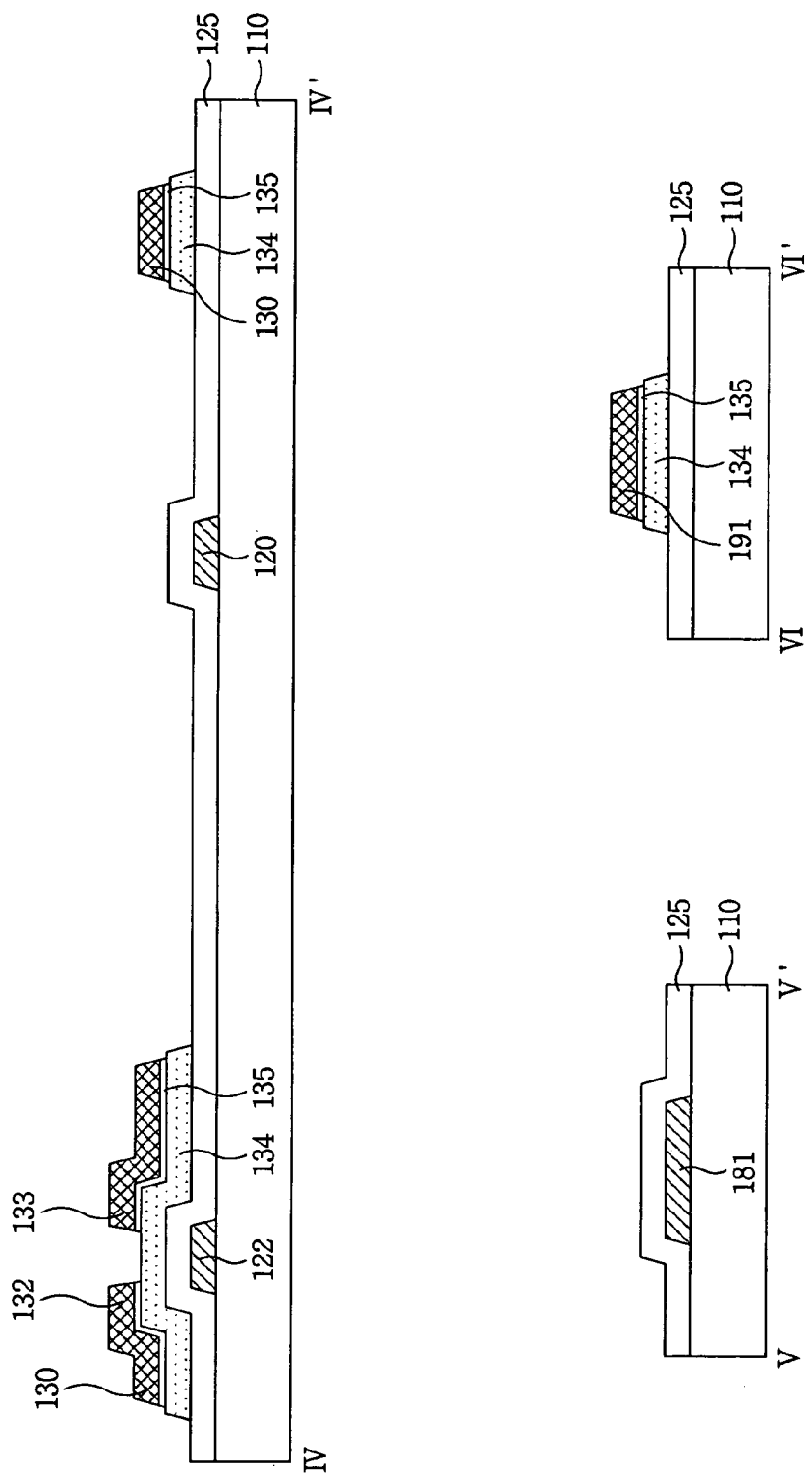

As described above, after forming the first conductive pattern on the lower substrate 110, there are formed a second conductive pattern and a semiconductor pattern inclusive of an ohmic contact layer and an active layer, which forms a channel on the lower substrate 110 where the first conductive pattern is formed, by a second mask process, as shown in FIGS. 10A and 10B.

Referring to FIGS. 10A and 10B, after spreading the gate insulating film 125 on the lower substrate 110 where the first conductive pattern is formed, a photolithography process using a first mask 200 is performed, thereby forming the semiconductor pattern inclusive of the ohmic contact layer 135 and the active layer 134 forming the channel; and a second conductive pattern inclusive of the data line 130, the source electrode 132 connected to the data line 130, the drain electrode 133 which faces the source electrode 132 with the channel therebetween, and the data pad lower electrode 191.

To describe this more specifically, the gate insulating film 125 is deposited on the entire surface of the lower substrate 110 where the first conductive pattern is formed by the deposition method such as PECVD, sputtering, etc, as shown in FIG. 11A.

Herein, the gate insulating film 125 is formed of an inorganic insulating material such as silicon oxide SiOx, silicon nitride SiNx, etc.

Figure 11B:
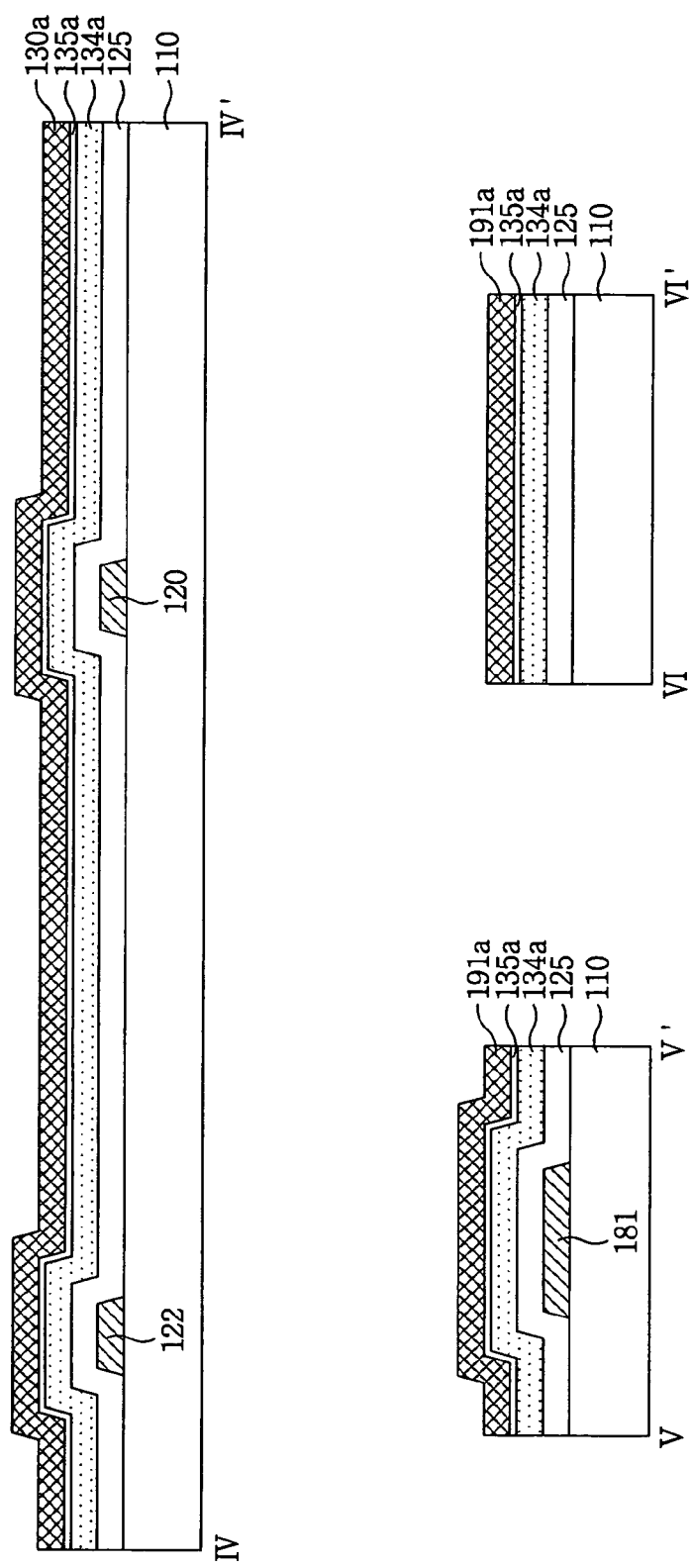

Then, as shown in FIG. 11B, an amorphous silicon layer 134A, an n+ amorphous silicon layer 135A and a data metal layer 135A are sequentially deposited on the gate insulating film 125 by the deposition method such as PECVD, sputtering, etc.

Herein, the data metal layer 130A is formed of molybdenum Mo, titanium Ti, tantalum Ta, molybdenum Mo alloy, etc.

Figure 11C:
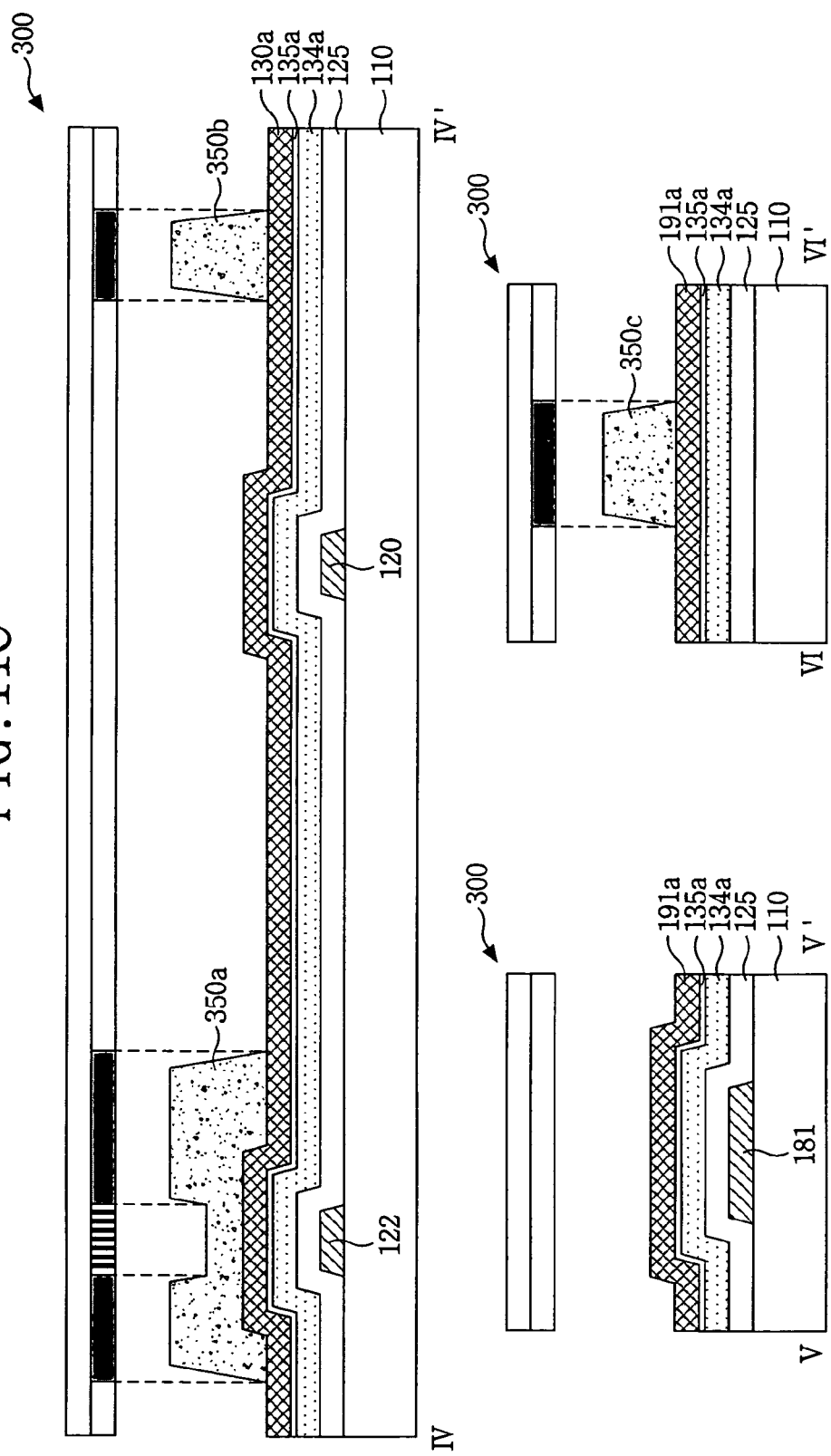

Then, after a photo-resist is spread over the entire surface of the data metal layer 130A, a photolithography process using a third mask 300 being a diffractive exposure mask is performed, thereby forming a photo-resist pattern 350 having a stepped difference on the data metal layer 130A, as shown in FIG. 11C.

Herein, the third mask 300 is a halftone mask where a diffractive exposure part (or semi transmission part) corresponds to an area where the channel of the thin film transistor 140 is to be formed.

Accordingly, the photo-resist pattern 350A formed in the channel area of the thin film transistor 140 has a lower height than the photo-resist pattern 350B formed in an area where the data line 130 is to be formed or the photo-resist pattern 350C formed in an area where the data pad lower electrode 191 is to be formed.

Figure 11D:
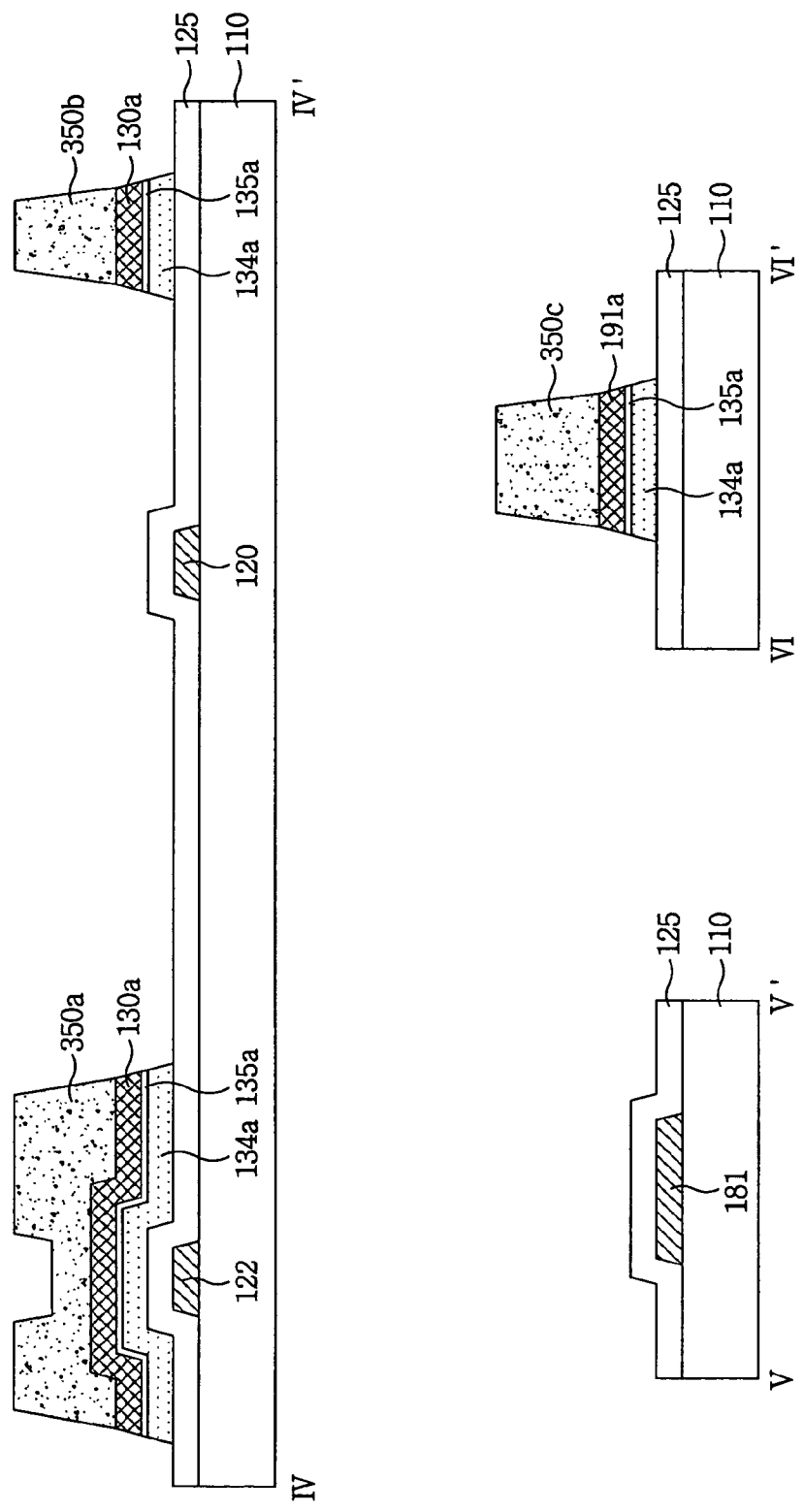

As described above, after forming the photo-resist pattern 350 having a stepped difference on the data metal layer 130A, the data metal layer 130A exposed by the photo-resist pattern 350 is removed by a wet etching, as shown in FIG. 11D.

Then, the photo-resist pattern 350A covering the channel area is removed by an ashing process using oxygen $O_2$ plasma, the data metal layer formed in the channel area of the thin film transistor 140 is exposed, as shown in FIG. 11E.

At this moment, a part of the photo-resist pattern 350B, 350C covering the area where the data line 130 is to be formed and the area where the data pad lower electrode 191 is to be formed is removed by the ashing process using the oxygen $O_2$ plasma.

Figure 11F:
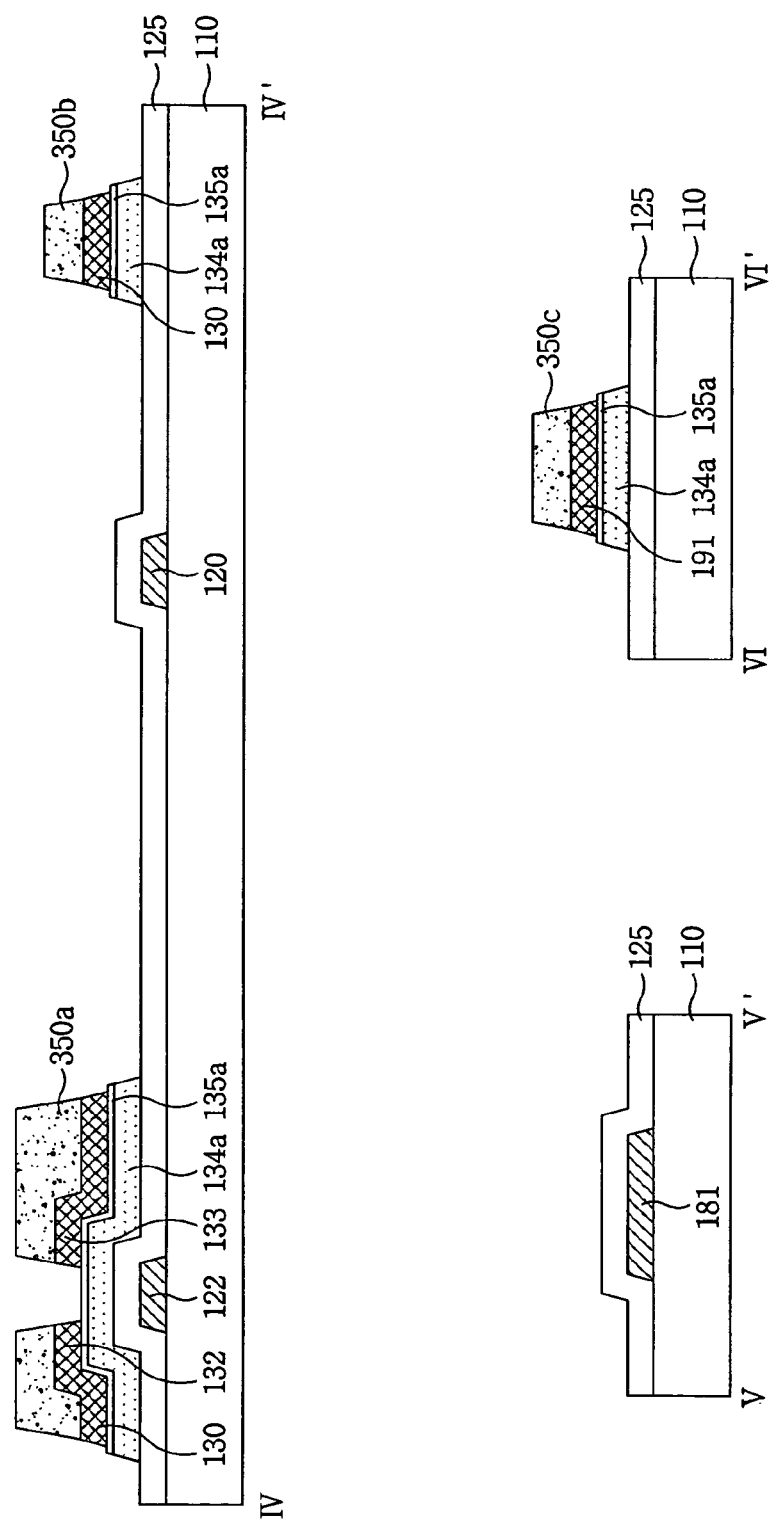

Then, the data metal layer 130A exposed by the ashed photo-resist pattern 350 is removed by a dry etching, thereby dividing the data metal layer 130A into the source electrode 132 and the drain electrode 133 and opening the n+ amorphous silicon layer 135A formed in the channel area at the same time, as shown in FIG. 11F. At this time, the data pad lower electrode 191 is also formed.

As described above, the opened n+ amorphous silicon layer 135A is removed by the dry etching to open the amorphous silicon layer 134A, thereby forming the ohmic contact layer 135 and the active layer 134 which sets the channel between the source electrode 132 and the drain electrode 133, as shown in FIG. 11G.

Figure 11H:
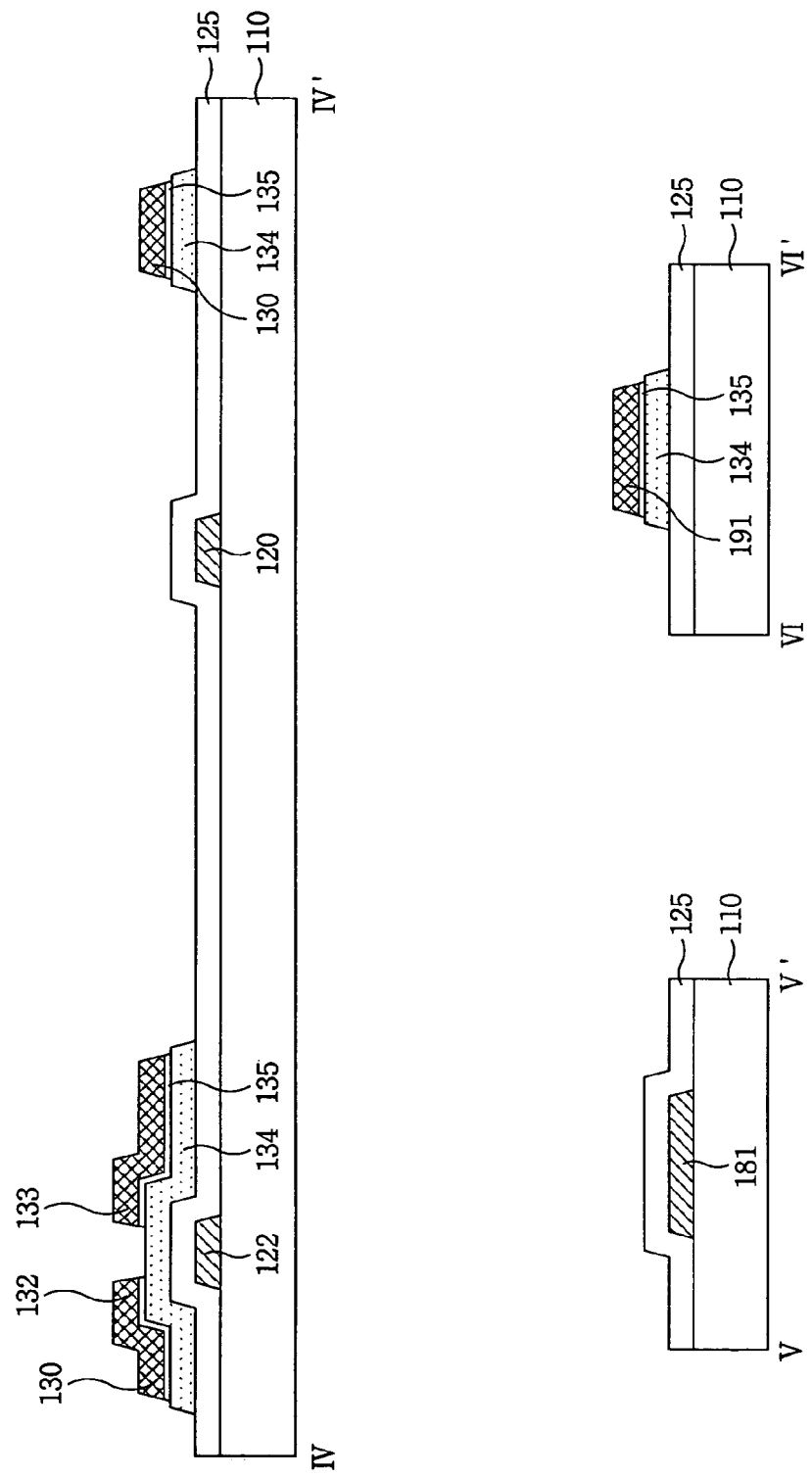

Then, the remaining photo-resist pattern 350 is removed by a stripping process, thereby forming the second conductive pattern inclusive of a semiconductor pattern forming the channel of the thin film transistor 140, the data line 130, the source electrode 132 connected to the data line 130, the drain electrode 133 which faces the source electrode 132 with the channel therebetween, and the data pad lower electrode 191, as shown in FIG. 11H.

Figure 12A:
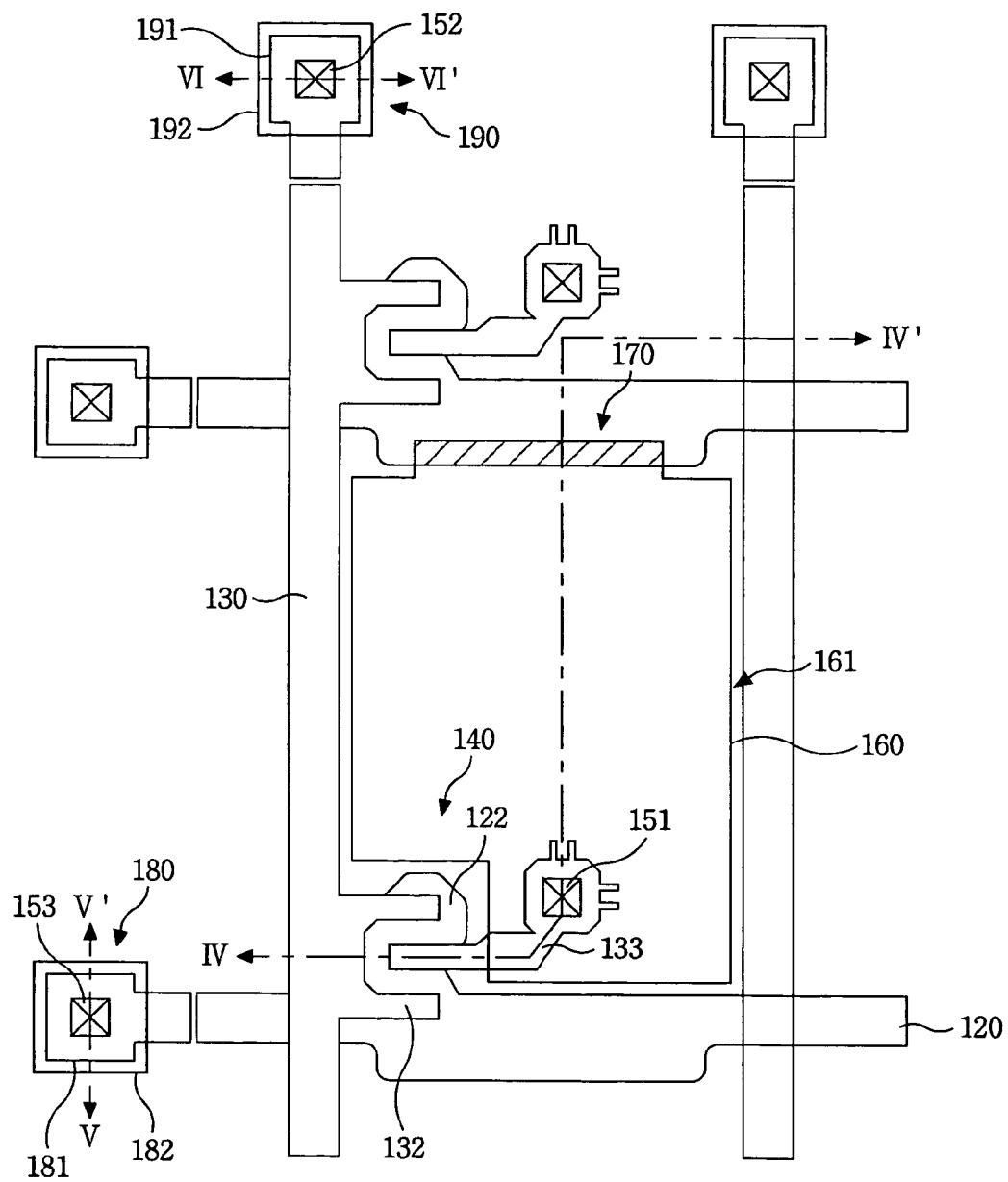

As described above, after forming the second conductive pattern, a third conductive pattern is formed on the passivation film where a plurality of contact holes are formed by a third mask process, as shown in FIGS. 12A and 12B.

Referring to FIGS. 12A and 12B, a third conductive pattern inclusive of the passivation film 150 where first to third contact holes 151, 152, 153 are formed, the pixel electrode 160 formed on the passivation film 150, the gate pad upper electrode 182 and the data pad upper electrode 192 are formed by the photolithography process using a third mask on the gate insulating film 125 where the second conductive pattern is formed.

Figure 13A:
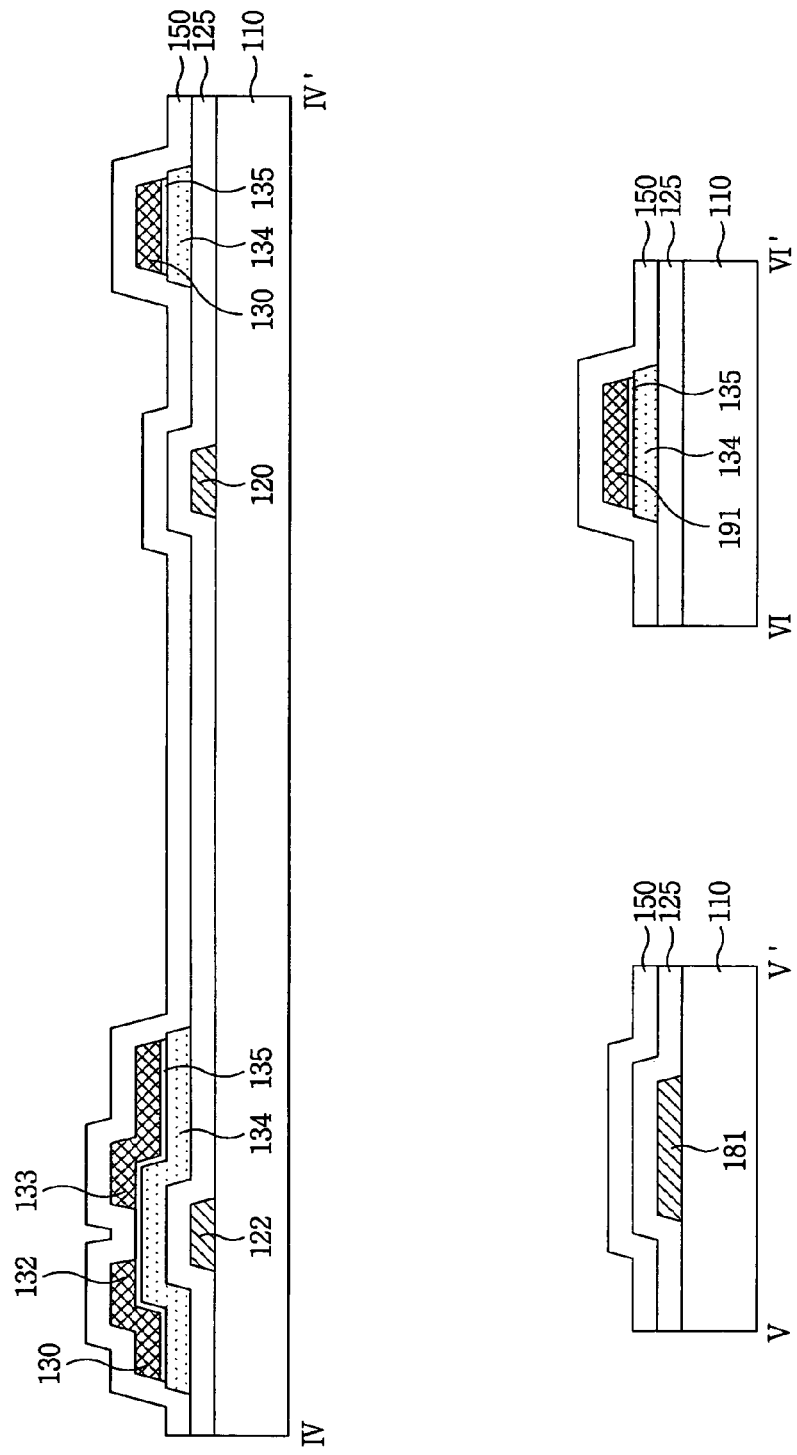

To describe this more specifically, as shown in FIG. 13A, the passivation film 150 is deposited on the entire surface of the gate insulating film 125 where the second conductive pattern is formed.

Figure 13B:
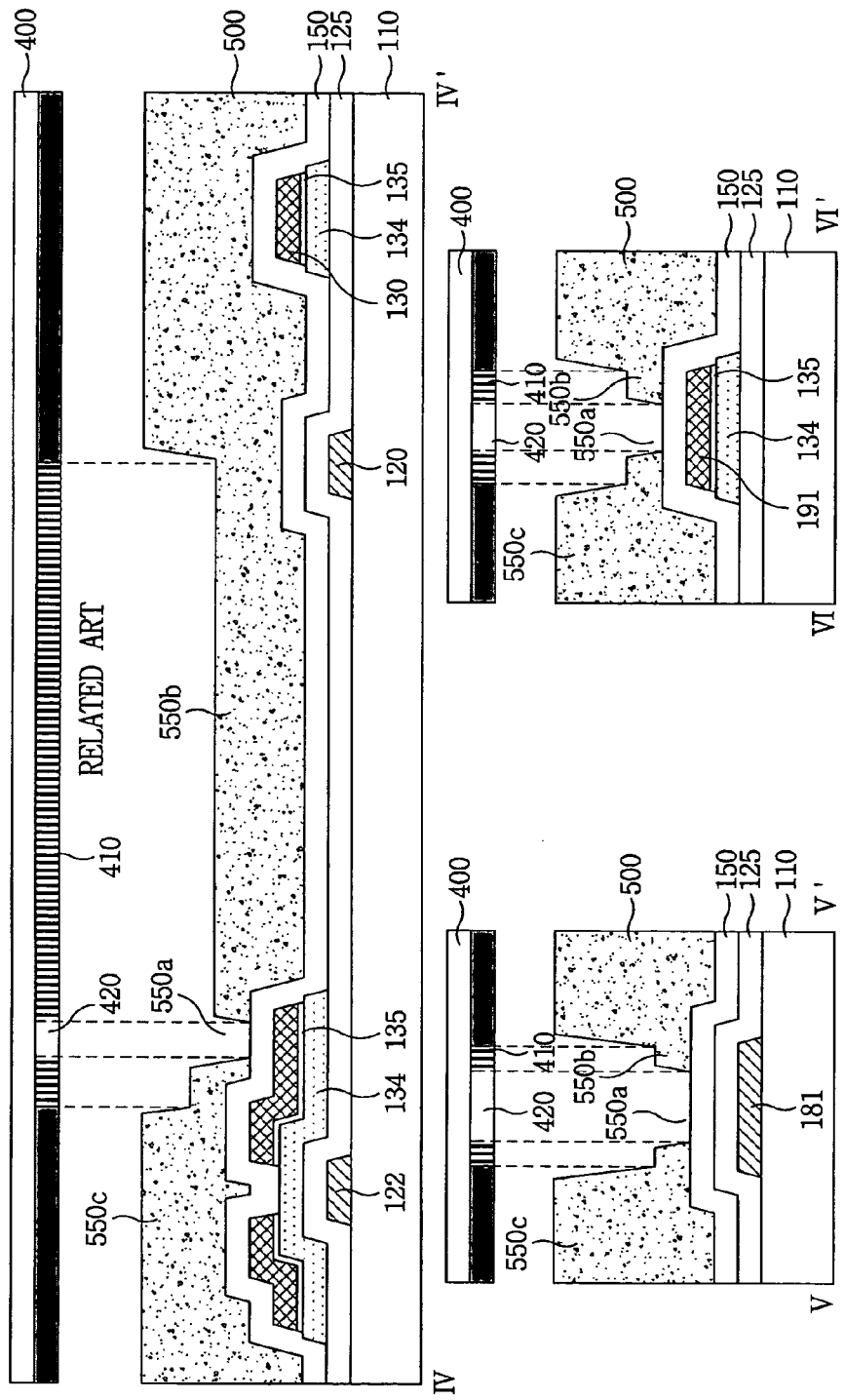

Then, after depositing a first photo-resist 500 on the entire surface of the passivation film 150, the photolithography process using the third mask being the diffractive exposure mask is performed, thereby forming a photo-resist pattern 550 having a stepped difference on the passivation film 150, as shown in FIG. 13B.

Herein, the third mask 400 is the diffractive exposure mask where the diffractive exposure part (or semi transmissive part) is formed in an area where the pixel electrode is to be formed, a transmissive part is formed in an area where the contact holes 151, 152, 153 are to be formed, and a shielding part is formed in an area other than the semi transmissive and transmissive areas.

Accordingly, the photolithography process for the first photo-resist 500 is performed by use of the third mask 300, thereby forming a photo-resist pattern 550 inclusive of an open hole 550A for forming the contact holes 151, 152, 153 on the passivation film 150, a photo-resist pattern 550B formed in the area where the third conductive pattern is to be formed, and a photo-resist pattern 550C formed in the area other than those areas.

At this moment, the photo-resist pattern 550B formed in the area where the third conductive pattern is to be formed by the diffractive exposure part of the third mask 400 has a lower height than the photo-resist pattern 550C formed in the area other than those areas.

Figure 13C:
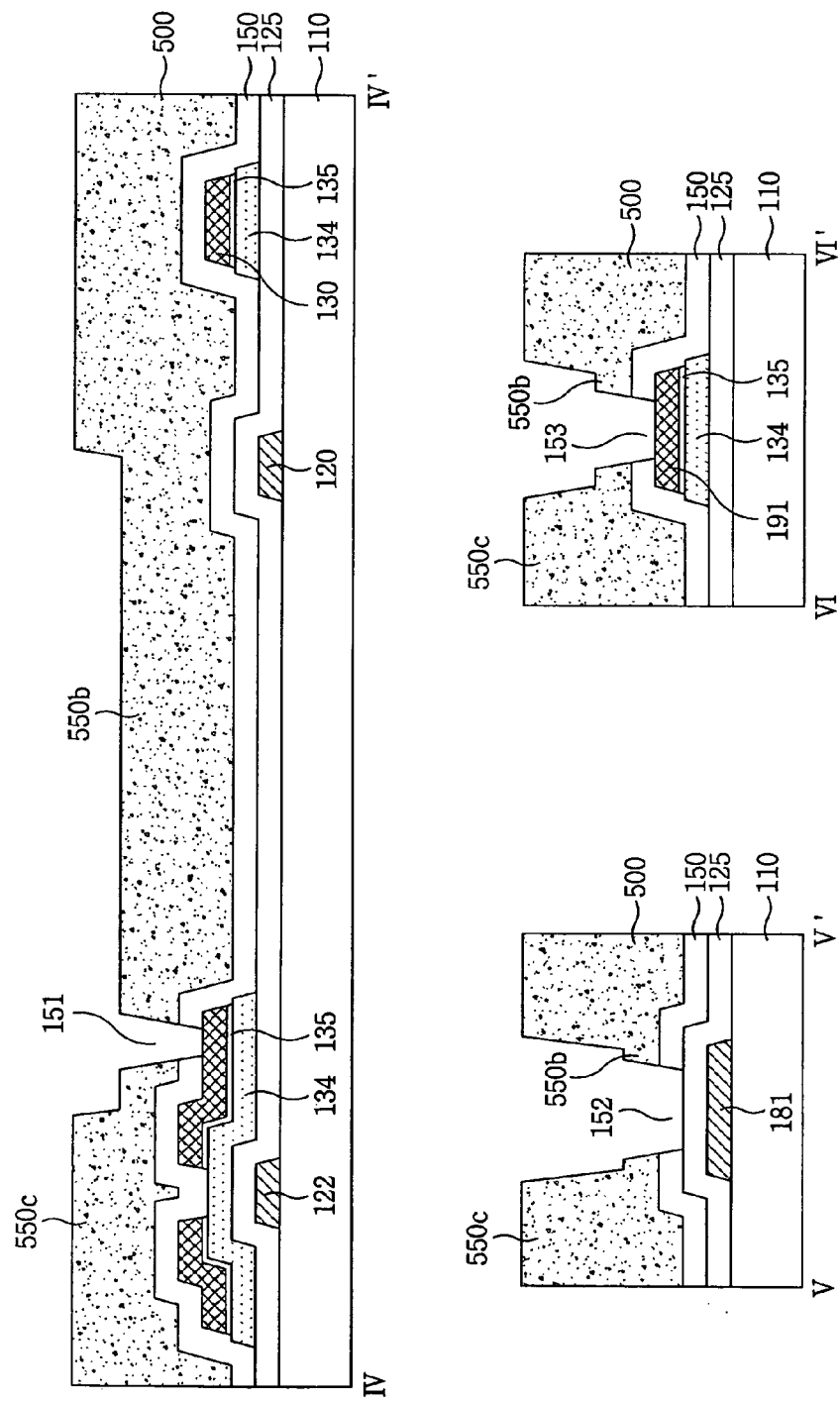

As described above, after forming the photo-resist pattern 550 having the stepped difference on the passivation film 150, the dry etching for the exposed passivation film 150 is performed by the photo-resist pattern 550A to form the first to third contact holes 151, 152, 153, as shown in FIG. 13C.

Herein, the first contact hole 151 penetrates the passivation film 150 to expose the drain electrode, the second contact hole 152 penetrates the passivation film 150 and the gate insulating film 125 to expose the gate pad lower electrode 181, and the third contact hole 153 penetrates the passivation film 150 to expose the data pad lower electrode 192.

As shown in FIG. 13D, the data pad lower electrode 191 and the drain electrode 133 exposed by a contact hole formed on the passivation film 150 are etched.

Figure 13E:
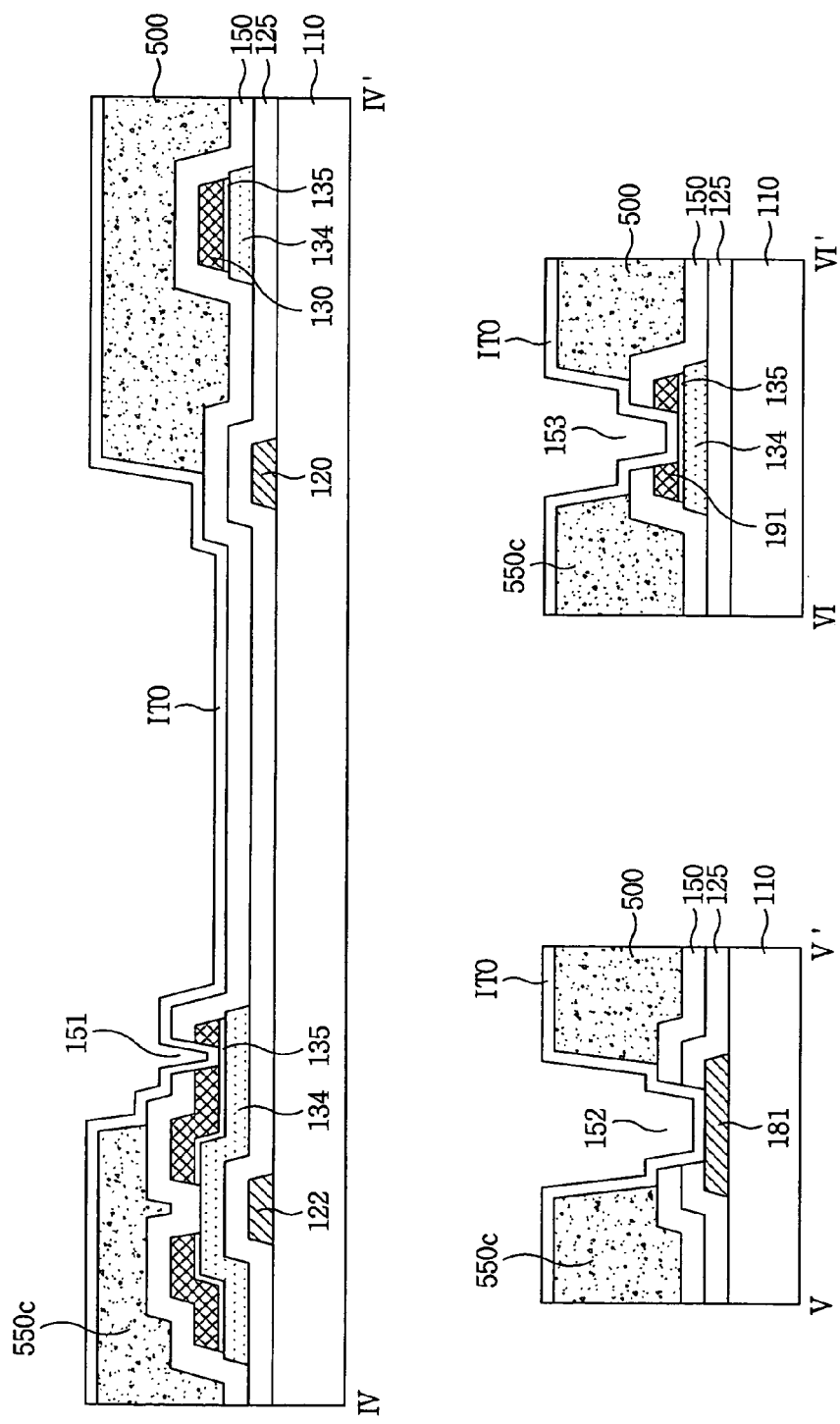

Then, after an ashing process for the photo-resist pattern 550 is performed by use of the oxygen O2 plasma, a transparent conductive film ITO for forming the third conductive pattern inclusive of the pixel electrode 160, the gate pad upper electrode 182 and the data pad upper electrode 192 is deposited on the entire surface of the exposed passivation film 150 and the photo-resist pattern 550 of which the height is lowered by the ashing process, as shown in FIG. 13E.

As described above, after depositing the transparent conductive film ITO on the entire surface of the passivation film 150 and the ashed photo-resist pattern 550, a second photo-resist 600 is deposited on the entire surface of the passivation film 150 and the photo-resist pattern 550 where the transparent conductive film ITO is formed, and then a heat treatment is performed, as shown in FIG. 13F.

The transparent conductive film ITO formed on the photo-resist pattern 550 by the heat treatment has an amorphous structure, but the transparent conductive film ITO spread over the second photo-resist 600 is changed to have a poly structure.

Figure 13G:
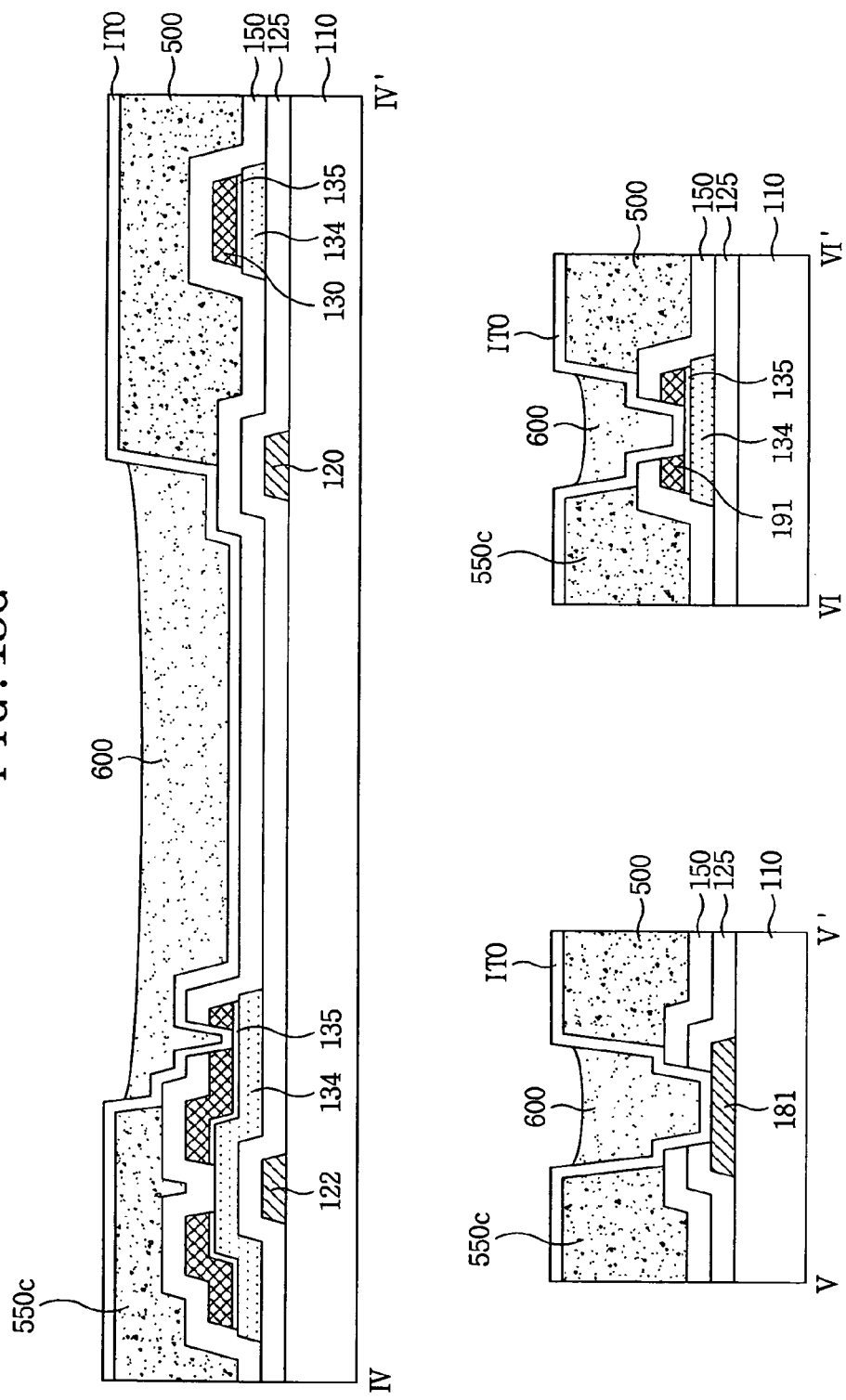

Then, the ashing process for the second photo-resist 600 is performed by use of the oxygen $O_2$ plasma, thereby exposing the transparent conductive film ITO formed on the photo-resist pattern 550 which is formed by the first photo-resist 500, as shown in FIG. 13G.

As described above, after exposing the transparent conductive film ITO which is formed on the ashed photo-resist pattern 550, the transparent conductive film ITO exposed on the photo-resist pattern 550 is removed by the wet etching, as shown in FIG. 13H.

The transparent conductive film ITO forming the third conductive pattern covered by the second photo-resist 600 is not removed due to an etching selection ratio with the transparent conductive film ITO having an amorphous structure which is formed on the photo-resist pattern 550.

Then, the photo-resist pattern 550 and the second photo-resist 600 which remain on the passivation film 150 are removed by a stripping process, the third conductive pattern inclusive of the pixel electrode 160, the gate pad upper electrode 182 and the data pad upper electrode 192 is formed on the passivation film 150, as shown in FIG. 13I.

Herein, the pixel electrode 160 is connected to the drain electrode 133 of the thin film transistor 140 through the first contact hole 151 which penetrates the passivation film 150 and forms an electric field for aligning liquid crystal together with the common electrode. The pixel electrode 160 is formed to overlap the gate line 120 with the gate insulating film 125 and the passivation film 150 therebetween, thereby forming a storage capacitor 170.

The gate pad upper electrode 182 is connected to the gate pad lower electrode through the second contact hole 152 which penetrates the passivation film 150 and the gate insulating film 125. Herein, the gate pad upper electrode 182 is formed in a projected shape on the gate pad 180.

And, the data pad upper electrode 192 is connected to the data pad lower electrode through the third contact hole 153 which penetrates the passivation film 150, the semiconductor layer 134 and the gate insulating film 125. Herein, the gate pad upper electrode 192 is formed in the projected shape on the gate pad 190.

As described above, the fabricating method of the thin film transistor substrate according to the present invention provides an effect that the good pattern design can be formed and the stepped difference can be removed at the same time by the three mask process.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A fabricating method of a thin film transistor substrate, comprising:

forming a gate line on a substrate;

forming a data line which crosses the gate line with a gate insulating film therebetween, wherein the crossing of the data and gate lines form pixel regions;

forming a thin film transistor at a crossing part of the gate line and the data line;

forming a passivation film on the gate insulating film;

after forming the passivation film, forming a first photo-resist pattern in the pixel regions;

depositing a transparent conductive film on an entire surface of the passivation film;

after the depositing of the transparent conductive film, forming a second photo-resist pattern that exposes the transparent conductive film formed in an area other than the area where the first photo-resist pattern is formed in the pixel region; and removing the first and second photo-resist patterns which remain on the passivation film after etching the transparent conductive film which is exposed by the second photo-resist pattern, wherein forming the second photo-resist pattern comprises, forming a photo-resist on the entire surface of the passivation film after forming the transparent conductive film on the passivation film where the first photo-resist pattern is formed; and ashing the photo-resist to expose the transparent conductive film formed in an area other than the passivation film area where the contact hole and the pixel electrode are to be formed, and wherein performing a heat treatment to polymerize the transparent conductive film covered by the second photo-resist pattern after forming the photo resist on the entire surface of the passivation film.

2. The fabricating method according to claim 1, further comprising:
   forming a storage capacitor including the gate line and the pixel electrode wherein the storage capacitor overlaps the gate line with the gate insulating film and the passivation film therebetween.

3. The fabricating method according to claim 1, further comprising:
   forming a gate pad including a gate pad lower electrode connected to the gate line, a contact hole which penetrates the passivation film and the gate insulating film to expose the gate pad lower electrode, and a gate pad upper electrode connected to the gate pad lower electrode through the contact hole, and
   wherein the gate pad upper electrode is formed in a projected shape on the gate pad.

4. The fabricating method according to claim 1, further comprising:
   forming a data pad including a data pad lower electrode connected to the data line, a contact hole which penetrates the passivation film to expose the data pad lower electrode, and a data pad upper electrode connected to the data pad lower electrode through the contact hole, wherein the data pad upper electrode is formed in a projected shape on the data pad.

5. The fabricating method according to claim 1, wherein forming the first photo-resist pattern comprises:
   forming the first photo-resist;
   forming the passivation film on the entire surface of the gate insulating film;
   opening a portion of the photo-resist of the passivation area where a contact hole is to be formed by a photolithography process using a mask;
   partially etching the photo-resist of the passivation film area where the pixel electrode is to be formed by the photolithography process using the mask; and
   ashing the photo-resist to partially remove the photo-resist in the passivation film where the pixel electrode is to be formed.

6. The fabricating method according to claim 3, wherein the step of forming the contact hole on the passivation film comprises:
   forming a first contact hole to expose a drain electrode, wherein the first contact hole penetrates the passivation film;
   exposing a gate pad lower electrode by penetrating the passivation film and the gate insulating film; and
   exposing a drain pad lower electrode by penetrating the passivation film.

7. A fabricating method of a thin film transistor substrate, comprising:
   forming a first conductive pattern inclusive of a gate line, a gate electrode connected to the gate line and a gate pad lower electrode on a substrate;
   forming a semiconductor pattern that forms a channel on a gate insulating film which covers the substrate and a second conductive pattern inclusive of a data line, a source electrode connected to the data line, a drain electrode which faces the source electrode with the channel therebetween and a data pad lower electrode;
   forming a passivation film on the gate insulating film;
   forming a first photo-resist pattern for opening and exposing a portion of the passivation film where a contact hole and a pixel electrode are to be formed;
   depositing a transparent conductive film on the entire surface of the passivation film;
   forming a second photo-resist pattern that exposes the transparent conductive film formed in an area other than the passivation film area;
   removing the transparent conductive film exposed by the second photo-resist pattern; and
   forming a third conductive pattern inclusive of the pixel electrode, a gate pad upper electrode and a data pad upper electrode by removing the first and second photo-resist patterns which remain on the passivation film,
   wherein performing a heat treatment for polymerizing the transparent conductive film which is covered by the second photo-resist pattern after forming the photo-resist on the entire surface of the passivation film,
   wherein forming the second photo-resist pattern comprises,
   forming the transparent conductive film on the entire surface of the passivation film where the first photo-resist pattern is formed;
   forming a photo-resist on the entire surface of the passivation film where the transparent conductive film is formed; and
   ashing the photo-resist to expose the transparent conductive film formed in an area other than the passivation film area where the contact hole and the pixel electrode are to be formed and
   wherein performing a heat treatment for polymerizing the transparent conductive film which is covered by the second photo-resist pattern after forming the photo-resist on the entire surface of the passivation film.

8. The fabricating method according to claim 7, wherein forming the first conductive pattern comprises:
   depositing a gate metal layer on the entire surface of a substrate;
   forming a photo-resist pattern which exposes the gate metal layer by a photolithography process using a first mask after forming a photo-resist on the gate metal layer;
   etching the gate metal layer exposed by the photo-resist pattern; and
   removing the photo-resist pattern which remains on the etched gate metal layer by a stripping process.

9. The fabricating method according to claim 7, wherein forming the second conductive pattern comprises:
   sequentially forming the gate insulating film, the semiconductor pattern inclusive of an ohmic contact layer and an active layer which form the channel, and a data metal layer on the substrate where the first conductive pattern is formed;
   forming the photo-resist pattern of which the channel is partially etched by a photolithography process using a second mask after forming the photo-resist on the entire surface of the data metal layer;
   sequentially etching the exposed data metal layer, the ohmic contact layer and the active layer by the partially etched photo-resist pattern; and
   removing the photo-resist pattern which remains on the etched data metal layer by a stripping process.

10. The fabricating method according to claim 7, wherein forming the first photo-resist pattern on the passivation film comprises:

forming the passivation film on the entire surface of the gate insulating film where the second conductive pattern is formed;

partially opening and etching the photo-resist of the passivation film area where the contact hole and the pixel electrode are to be formed by a photolithography process using a third mask after forming the photo-resist on the entire surface of the passivation film; and ashing the photo-resist to remove the photo-resist which is partially removed in the passivation film where the pixel electrode is to be formed.

11. The fabricating method according to claim 10, wherein forming the contact hole on the passivation film comprises:

forming a first contact hole which penetrates the passivation film to expose a drain electrode of the thin film transistor;

forming a second contact hole which penetrates the passivation film and the gate insulating film to expose the gate pad lower electrode; and forming a third contact hole which penetrates the passivation film to expose the data pad lower electrode.

12. The fabricating method according to claim 7, wherein forming the passivation film and the third conductive pattern comprises:

removing the transparent conductive film exposed by the second photo-resist pattern;

forming a contact hole on the passivation film by removing the first and second photo-resist patterns; and forming the pixel electrode, the gate pad upper electrode and the data pad upper electrode on the passivation film where the contact hole is formed.

13. The fabricating method according to claim 12, wherein forming the contact hole on the passivation film comprises:

forming a first contact hole which penetrates the passivation film to make the pixel electrode in contact with the drain electrode of the thin film transistor;

forming a second contact hole which penetrates the passivation film and the gate insulating film to make the gate pad lower electrode in contact with the data pad upper electrode; and forming a third contact hole which penetrates to make the data pad lower electrode in contact with the data pad upper electrode.

14. The fabricating method according to claim 12, wherein the gate pad upper electrode is formed in a projected shape in an upper part of a gate pad, and the data pad upper electrode is formed in a projected shape in an upper part of a data pad.

* * * * *